United States Patent
Trulli et al.

(10) Patent No.: US 10,709,011 B2
(45) Date of Patent: Jul. 7, 2020

(54) RADIO FREQUENCY (RF) SHIELDING STRUCTURE FOR RF CONNECTOR TO MICROWAVE TRANSMISSION INTERCONNECT REGIONS AND METHODS FOR MANUFACTURING SUCH RF SHIELDING STRUCTURE

(71) Applicant: Raytheon Company, Waltham, MA (US)

(72) Inventors: Susan C. Trulli, Lexington, MA (US); Christopher M. Laighton, Boxborough, MA (US); Elicia K. Harper, Chelsea, MA (US)

(73) Assignee: Raytheon Company, Waltham, MA (US)

( * ) Notice: Subject to any disclaimer, the term of this patent is extended or adjusted under 35 U.S.C. 154(b) by 51 days.

(21) Appl. No.: 15/884,756

(22) Filed: Jan. 31, 2018

(65) Prior Publication Data

US 2019/0239340 A1   Aug. 1, 2019

(51) Int. Cl.
*H05K 1/02* (2006.01)
*G06F 1/18* (2006.01)
(Continued)

(52) U.S. Cl.
CPC ........... *H05K 1/0233* (2013.01); *G06F 1/182* (2013.01); *H01P 5/085* (2013.01); *H01R 9/0515* (2013.01);
(Continued)

(58) Field of Classification Search
CPC .... H01P 5/085; H05K 1/0233; H05K 9/0066; G06F 1/182; H01R 13/719
See application file for complete search history.

(56) References Cited

U.S. PATENT DOCUMENTS 5,165,055 A   11/1992  Metsler
6,457,979 B1  10/2002  Dove
(Continued)

FOREIGN PATENT DOCUMENTS

JP           08321359      12/1996
JP         2011065886       3/2011
WO    WO 2017/111029 A1    6/2017

OTHER PUBLICATIONS

Notification of Transmittal of the International Search Report and Written Opinion of the ISA dated Apr. 18, 2019, for International Application No. PCT/US2019/012270; 1 Page.
(Continued)

*Primary Examiner* — Robert J Pascal
*Assistant Examiner* — Kimberly E Glenn
(74) *Attorney, Agent, or Firm* — Daly, Crowley, Mofford & Durkee, LLP

(57) ABSTRACT

An electrically conductive shield for a microwave transmission line-electrical connector interconnect region wherein the microwave transmission line is connected to the electrical connector. An elastic, dielectric material is disposed between opposing surfaces of the dielectric structure and the housing. An electrically conductive material is disposed on an outer surface of the elastic, dielectric material to provide an electrically conductive shield. The electrically conductive shield is disposed over the opposing surfaces of the dielectric structure and the housing.

27 Claims, 22 Drawing Sheets

(51) Int. Cl.
   *H05K 9/00*      (2006.01)
   *H01R 13/719*    (2011.01)
   *H01R 13/6599*   (2011.01)
   *H01R 24/50*     (2011.01)
   *H01R 9/05*      (2006.01)
   *H01P 5/08*      (2006.01)
   *H01R 13/6584*   (2011.01)
   *H01R 24/44*     (2011.01)
   *H01R 12/72*     (2011.01)

(52) U.S. Cl.
   CPC ..... *H01R 13/6584* (2013.01); *H01R 13/6599* (2013.01); *H01R 13/719* (2013.01); *H01R 24/44* (2013.01); *H01R 24/50* (2013.01); *H05K 9/0066* (2013.01); *H01R 12/722* (2013.01)

(56) References Cited

U.S. PATENT DOCUMENTS

| | | | |
|---|---|---|---|
| 6,774,742 B1 * | 8/2004 | Fleury | H01P 5/085 333/260 |
| 2016/0020501 A1 | 1/2016 | Lindsey | |

OTHER PUBLICATIONS

International Search Report dated Apr. 18, 2019 for International Application No. PCT/US2019/012270;6 Pages.

Written Opinion of the ISA dated Apr. 18, 2019 for International Application No. PCT/US2019/012270, 16 Pages.

Harper et al., "Additive Manufacturing Applicationsin Electronic Packaging;" Proceedings of the Student Research Symposium, University of Massachusetts Lowell, Lowell, MA, Apr. 19, 2016; 1 Page.

Harper et al., "Printed Interconnects between Components for Microwave Applications;" University of Massachusetts Lowell, Lowell, MA; 1 Page.

Tehrani et al., "Inkjet-printed 3D interconnects for milirneter-wave system-on-package solutions;" 2016 IEEE MTT-S International Microwave Symposium (IMS), San Francisco, CA, 2016; Aug. 11, 2016, 4 pages.

Bijan K. Tehrani, Benjamin S. Cook, Manos M. Tentzeris, Inkjet-Printed 3D Interconnects for Millimeter-Wave System-on-Package Solutions, School of Electrical and Computer Engineering, Georgia Institute of Technology, Atlanta, Georgia, Kilby Labs, Texas Instruments, Dallas, Texas, 2016, IEEE, 4 pages.

* cited by examiner

RADIO FREQUENCY (RF) SHIELDING STRUCTURE FOR RF CONNECTOR TO MICROWAVE TRANSMISSION INTERCONNECT REGIONS AND METHODS FOR MANUFACTURING SUCH RF SHIELDING STRUCTURE

TECHNICAL FIELD

This disclosure relates generally to Radio Frequency (RF) shielding structures and methods and more particularly to RF shielding structures and methods for RF connector-to-microwave transmission interconnect regions.

BACKGROUND

As is known in the art, in many applications it is required to electrically connect electrical components in a chassis to elements outside the chassis. Such a connection is sometimes made using an electrical connector, as shown in FIGS. 1A and 1B having: an electrically conductive housing with a flange mounted to an outer conductive wall or bulkhead of the chassis, not shown; and, a signal pin passing through, but dielectrically insulated from, the electrically conductive wall of the housing. The signal pin passes through the outer electrically conductive wall of the chassis into an interior region of the chassis to make an electrical connection to an electrical component, not shown, within the chassis. When the electrical components are mounted to a printed circuit board, such components may be electrically interconnected through microwave transmission lines, such as, for example, microstrip transmission lines, stripline transmission lines, or coplanar waveguide transmission lines. More particularly, such transmission lines include: a dielectric structure; a signal strip conductor disposed on an upper surface of the dielectric structure; and a ground conductor disposed on the dielectric structure and insulated from the strip conductor. Thus, to make the connection between the electrical connector and the microwave transmission line, the electrically conductive housing is electrically connected to the ground conductor of the microwave transmission line and the signal pin has an end portion electrically connected to an upper portion of the signal strip conductor of the microwave transmission line. One such an arrangement is shown in FIGS. 1A, 1B, 11B' 1C and 1C' where the microwave transmission line is a microstrip transmission line and the electrical connector is a surface mount RF connector. Thus, the microstrip microwave transmission line includes: a signal strip conductor disposed on an upper surface of a dielectric structure of a printed circuit board; and a ground plane conductor disposed on the bottom surface of the dielectric structure. Here, electrically conductive vias (FIG. 1A) pass from the upper surface of the dielectric structure through the dielectric structure to the ground plane conductor. The connector includes: an electrically conductive housing having electrically conductive arms; a pair of upper arms are soldered, and hence electrically connected to the upper surface portions of the electrically conductive vias and a pair of lower arms are soldered, and hence electrically connected to the ground conductor on the bottom surface of the dielectric structure; and, a signal pin, dielectrically insulated from, the housing and disposed on, and electrically connected to, the end portion of the signal strip conductor, as shown in FIGS. 1B, 1C and 1C'; the other end of the signal strip conductor being connected to an electrical component, not shown. It should be understood that that other electrical components, not shown, are in the chassis and hence such components must be electrically shielded from any RF radiation that may propagate from a connector-to-microwave transmission line interconnect region (FIG. 1B) between the signal pin and signal strip conductor. However, as shown more clearly in FIGS. 1C and 1C', the front face of the dielectric structure is not perfectly flat and hence air gaps (FIG. 1C') result which can leak microwave energy. Further, as shown in FIGS. 1D and 1E, an electrically conductive shield, such as copper or aluminum is sometimes positioned over the microwave transmission line interconnect region. The electrically conductive shield is a self-supporting bridge-like structure with the mid-section, or top, suspended over, and hence insulated from, the soldered connector signal pin and signal strip conductor by an air gap and with the outer sides, or legs, of the electrically conductive shield connected to the upper arms of the conductor, as shown in FIGS. 1D and 1E, and therefore to the ground plane conductor through the conductive vias. It is noted that the top and legs of the electrically conductive shield have apertures or perforations passing through them as shown. Therefore, the electrically conductive shield does not inhibit RF from leaking out of the sides and therefore is only partially effective in providing RF shielding.

In some application, a bulkhead connector is used as shown in FIGS. 2A, 2B and 2C. It is noted that the printed circuit board in this example includes RF electrical components; here for example, Monolithic Microwave Integrated Circuits (MMICs) interconnected by microwave transmission lines, here stripline microwave transmission lines having a strip conductor separated from a pair of ground plane conductors by a dielectric structure of the printed circuit board. The bottom ground plane conductor is mounted to an electrical conductive layer, which may also be thermally conductive, for example a cold plate, or heat spreader, as shown. It is noted in the example shown that a cutout, or notch, is formed in the printed circuit board by removing an upper portion of the dielectric structure and portion of the upper ground plane conductor to expose an end portion of the transmission line strip conductor. In order to interface with external components, bulkhead connectors are provided, as shown. More particularly, the bulkhead connector is, in effect, a coaxial connector, which passes through the bulkhead and has an outer conductor mounted to the bulkhead with an inner conductor, or conductive pin, electrically insulated from the outer wall by suitable toroid shaped dielectric element. It is noted that the conductive pin has an end portion projecting outwardly from one side of the bulkhead for positioning on, and electrical connection with, an end portion of the strip conductor of the microwave transmission line. Thus, when the bulkhead and electrically conductive layer, with mounted printed circuit board, are mounted together as shown in FIG. 2C, because of manufacturing tolerances, there will typically be a gap in the connector-to-microwave transmission line interconnect region between the outer sidewall of the printed circuit board and the opposing outer sidewall of the bulkhead. In any event, the projecting portion of the connector pin and the portion of the transmission line, both exposed by the cutout, are soldered or otherwise affixed and electrically connected. However, RF radiation passing through the gap in the interconnect region may propagate outside the connector-to-microwave transmission line interconnect region and thereby interfere with neighboring electrical components.

One attempt used to solve this RF radiation problem is shown in FIGS. 3A-3E. Here, a piece of solid, electrically conductive metal shim stock, for example, Indium shim stock, is cut and placed against the side of the printed circuit board before bolting the bulkhead to the printed circuit board (FIGS. 3A and 3C) However, the metal shim stock does not have a perfectly flat face. (FIG. 3A) and therefore, when mounted to the bulkhead (FIGS. 3C and 3D) the metal shim does not create a perfect RF energy "seal" between the printed circuit board and bulkhead and because of the rough surface of the metal shim air gaps are formed as shown in FIG. 3D through which microwave energy may leak. In some cases the metal shim stock isn't applied before-hand, so the only solution is to cover the gap with dielectric tape having an upper surface coated with an electrically conductive material, such as copper, as shown in FIG. 3E. This method only keeps RF energy from radiating out of the top of the connector, leaving space or air gaps for RF energy to escape out the sides.

SUMMARY

In accordance with the present disclosure, an assembly is provided, comprising: a transmission line, comprising: a dielectric structure; a signal strip conductor disposed on an upper surface of the dielectric structure; and a ground conductor disposed on the dielectric structure. The assembly includes a connector comprising: an electrically conductive housing electrically connected to the ground conductor; and a conductive pin dielectrically separated from the conductive housing, the conductive pin having an end portion projecting outwardly from the housing onto, and electrically connected to, an upper portion of the signal strip conductor at an interconnect region. A dielectric, elastic material is disposed between opposing surfaces of the dielectric structure and the housing. A conductive layer is disposed over the dielectric, elastic material; the conductive layer being disposed on an outer surface of the dielectric, elastic material and electrically connected to the ground conductor.

In one embodiment, the electrically conductive housing and the dielectric structure are separated by a gap and wherein the dielectric, elastic material is disposed in the gap.

In one embodiment, the dielectric, elastic material has a Young's modulus selected, over a predetermined temperature range of both a temperature operating range $T_{OP}$ of the assembly and a storage temperature range $T_{SR}$ of the assembly to prevent the signal strip conductor line and the pin from being becoming electrically disconnected.

In one embodiment, an electrically conductive shield comprises: a dielectric support structure; and an electrically conductive layer is disposed on an outer surface of the dielectric support structure, the electrically conductive shield being disposed the opposing surfaces of the dielectric structure and the housing.

In one embodiment, an assembly is provided, comprising: a transmission line having: a dielectric structure; a signal strip conductor disposed on an upper surface of the dielectric structure; and a ground conductor disposed on the dielectric structure. The assembly tip includes: a connector comprising: an electrically conductive housing electrically connected to the ground conductor; and a conductive pin dielectrically separated from the conductive housing, the conductive pin having an end portion projecting outwardly from the housing onto, and electrically connected to, an upper portion of the signal strip conductor at an interconnect region. The electrically conductive housing and the dielectric structure are separated by a gap. The assembly includes a dielectric, elastic material disposed in the gap. A conductive layer is disposed over the dielectric, elastic material, the conductive layer being disposed on an outer surface of the dielectric, elastic material and is electrically connected to the ground conductor. An intermediate portion of the conductive pin extends from the housing to the interconnect region and passes over portions of the gap. The conductive layer provides electrical shielding to the intermediate portion of the conductive pin.

In one embodiment, an assembly is provided, comprising: a bulkhead; an electrically conductive layer; and a printed circuit board mounted on an upper surface of the electrically layer. The printed circuit board is separated from the bulkhead by a gap. The gap is disposed over a portion of the upper surface of the electrically conductive layer. The printed circuit board includes a transmission line having: an electrical conductor having inner portions disposed between a pair of ground plane conductors; and, an outer end portion exposed by a cutout in an upper portion of the printed circuit board. The assembly includes a bulkhead connector having a conductive pin projects outwardly from the bulkhead. An outer end portion of the conductive pin is disposed on, and electrically connected to, an outer portion of the electrical conductor with the outer end portion of the conductive pin being disposed over the gap. An elastic material having an electrically conductive upper surface and electrically side surfaces is disposed in the gap and on portion of the upper surface of the electrically conductive layer. An electrically conductive shield is electrically connected to: (a) the electrically conductive, upper surface of the elastic material; (b) the bulkhead; (c) an upper one of a pair of ground plane conductors of the printed circuit board. The electrically conductive shield is disposed over the outer end portion of the conductive pin of the bulkhead connector and the outer conductor portion of the printed circuit board.

In one embodiment, a method is provided, comprising: providing a transmission line, comprising: a dielectric structure; a signal strip conductor disposed on an upper surface of the dielectric structure; and a ground conductor disposed on the dielectric structure. The method includes providing a connector comprising: an electrically conductive housing electrically connected to the ground conductor; and a conductive pin dielectrically separated from the conductive housing, the conductive pin having an end portion projecting outwardly from the housing onto, and electrically connected to, an upper portion of the signal strip conductor at an interconnect region. A dielectric, elastic material is disposed between opposing surfaces of the dielectric structure and the housing. A conductive layer is disposed over the dielectric, elastic material; the conductive layer being disposed on an outer surface of the dielectric, elastic material and electrically connected to the ground conductor.

In one embodiment, the solid dielectric supporting structure and the electrically conductive material are formed using additive manufacturing.

With such an arrangement, an efficient a radio frequency shield for a connector-to-microwave transmission line interconnect region is provided. Further, the elastic material is used to close the gap between the connector and the printed circuit board. The additively written elastic material with the upper surface and selected side surfaces of the elastic material being electrically conductive providing a contiguous ground between the bulkhead and the printed circuit board. The electrically conductive shield provides, with the electrically conductive upper surface, a conductive enclosure to prevent unwanted radiation.

Further, with such an arrangement, the electrically conductive shielding structure has a Young's modulus selected, over a predetermined temperature range of both a temperature operating range $T_{OP}$ of the assembly and a storage temperature range $T_{SR}$ of the assembly to prevent the microwave transmission line and electrical connector from being becoming electrically disconnected.

The details of one or more embodiments of the disclosure are set forth in the accompanying drawings and the description below. Other features, objects, and advantages of the disclosure will be apparent from the description and drawings, and from the claims.

DESCRIPTION OF DRAWINGS

FIG. 1A being an exploded, perspective view; FIG. 1B being an assembled view; FIG. 1B being a top view; FIG. 1C' being an enlarged view or a region 1C-1C' in FIG. 1C;

FIG. 4B' is a cross-sectional sketch of the printed circuit board of FIG. 4A taken along line 4B'-4B' of FIG. 4B according to the disclosure;

FIGS. 7A-7D being at a first stage in such method wherein: FIG. 7A is an exploded view; FIG. 7B is a top view; FIG. 7C is a cross-sectional view, such cross-section being taken along line 7C-7C in FIG. 7B; FIG. 7C' is an enlarged view of a region 7C'-7C; of FIG. 7C; FIG. 7D is a bottom perspective view; FIGS. 7E-7I being at a second stage in such method wherein: FIG. 7E is a top perspective view; FIG. 7F is a side view; FIG. 7G is a bottom perspective view; FIGS. 7H-7I being at third stage in such method, wherein FIG. 7H is a top perspective view; FIG. 7I is a top view; are of a bottom perspective view; FIGS. 7J-7K being at the final stage in such method wherein FIG. 7J is a top perspective view; FIG. 7K is a rear perspective view; and FIG. 7L is a bottom perspective view;

Like reference symbols in the various drawings indicate like elements.

DETAILED DESCRIPTION

Figure 1A:
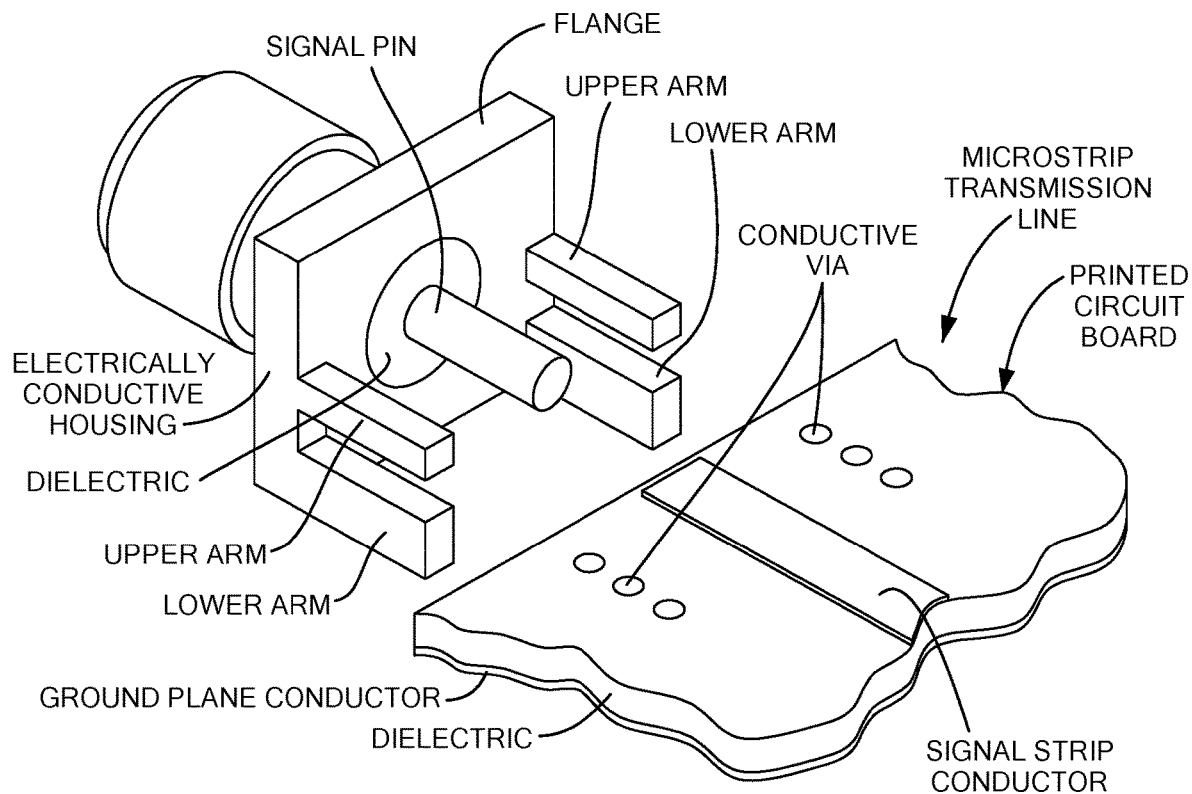
FIGS. 1A, 1B, 1B', 1C and 1C' are diagrammatical sketches showing the connection between an electrical connector and a microwave transmission line according to the PRIOR ART.
Figure 1B:
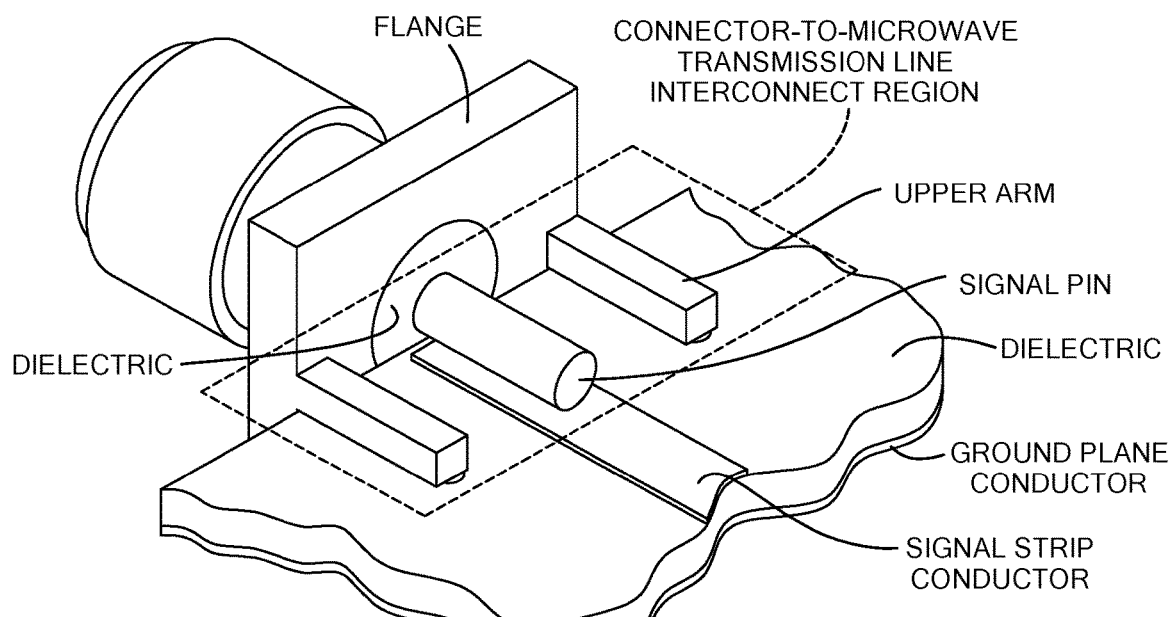
Figure 1B:
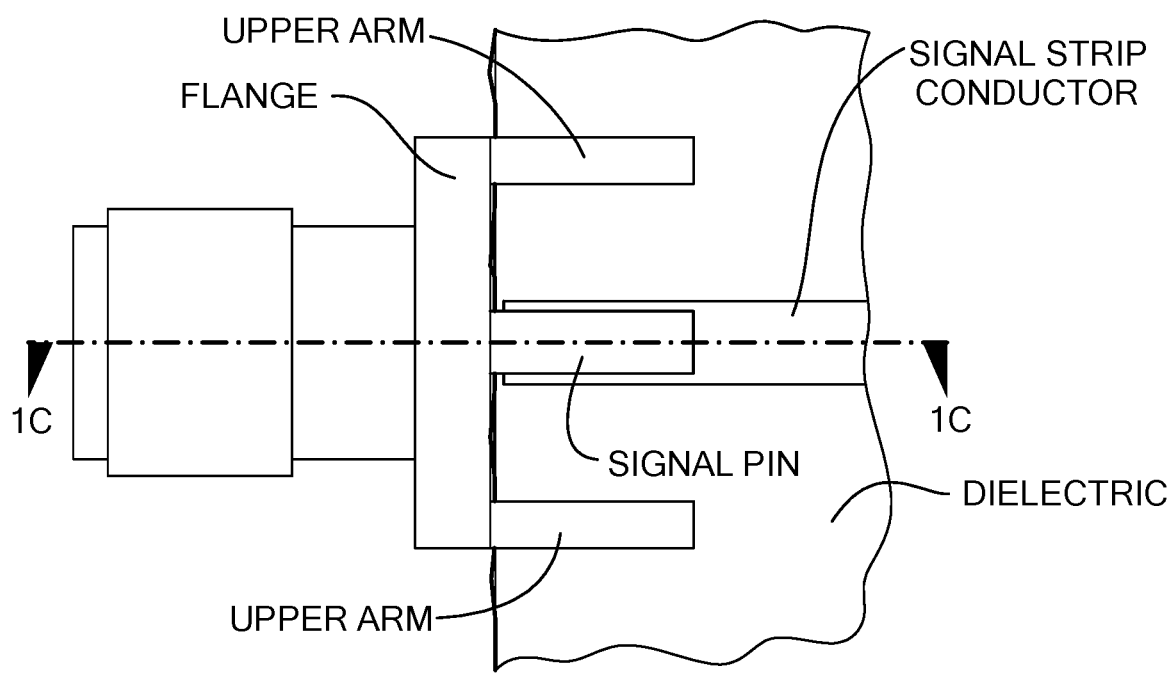
Figure 1C:
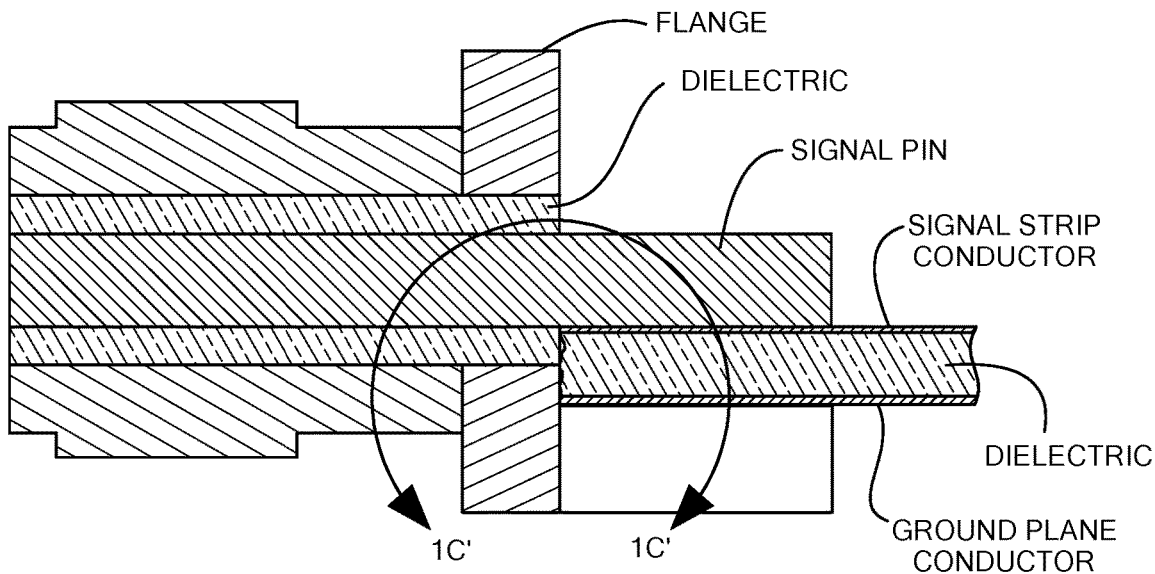
FIG. 1C being a cross-sectional view, such cross section being taken along line 1C-1C in FIG. 1B'.
Figure 1C:
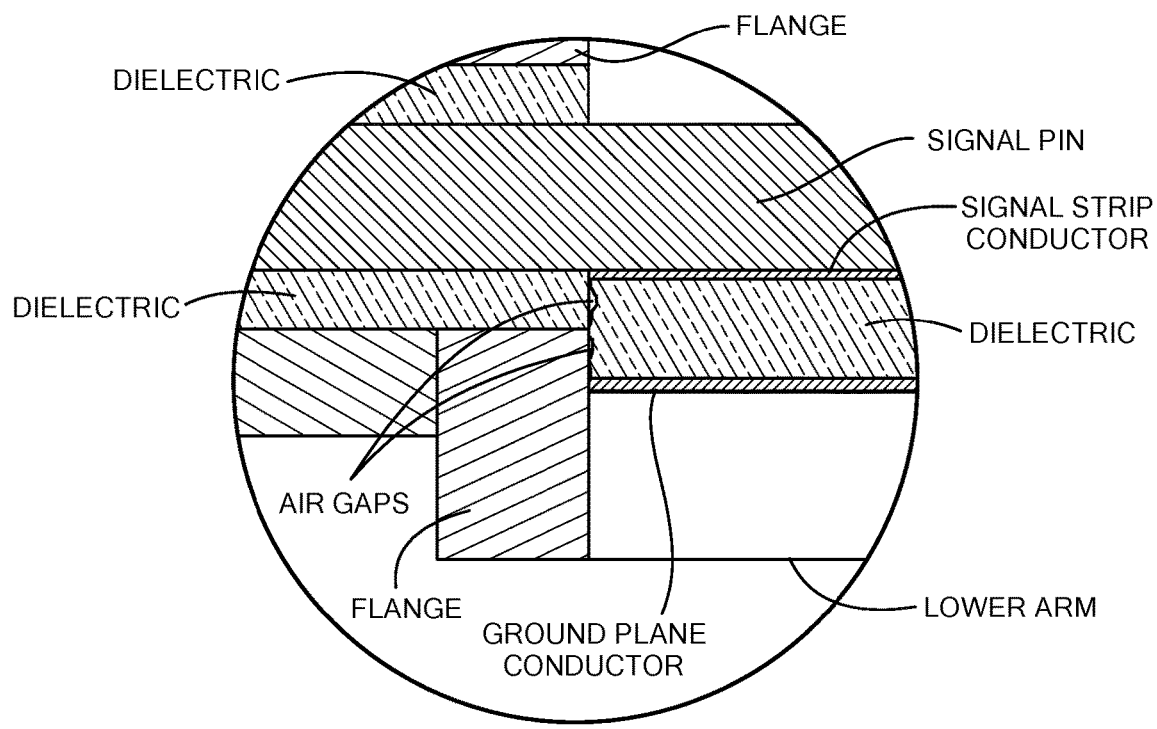
Figure 1D:
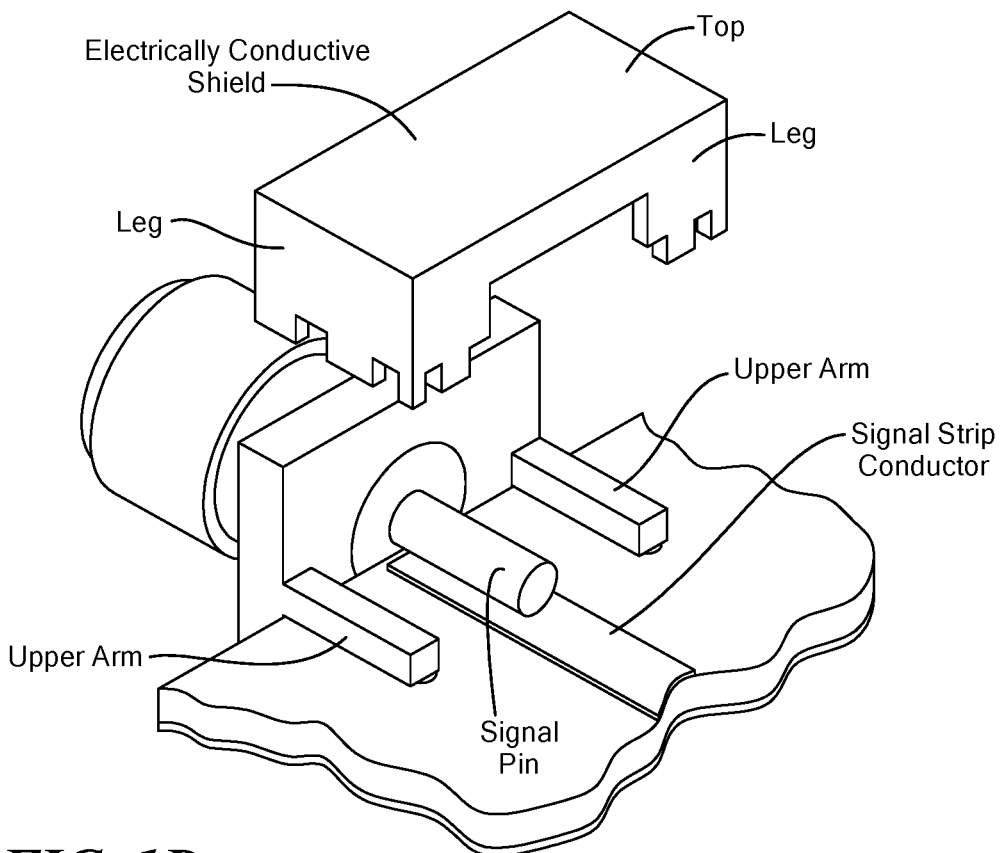
FIG. 1D is an exploded view showing the connection between the electrical connector and a microwave transmission line of FIG. 1A with an electrically conductive shield have apertures according to the PRIOR ART.
Figure 1E:
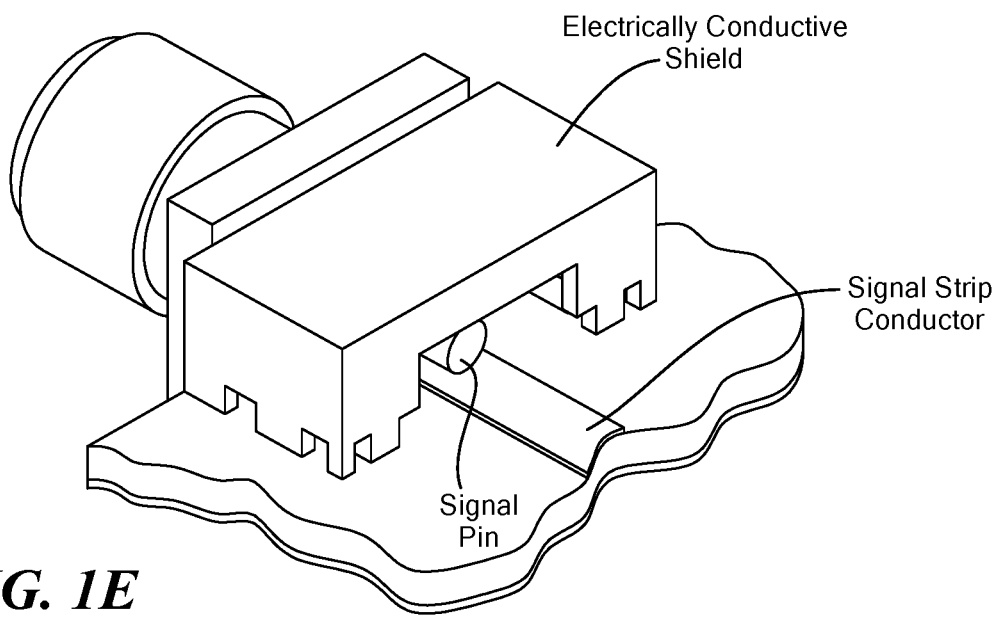
FIG. 1E is an assembled view showing the connection between the electrical connector and a microwave transmission line of FIG. 1D according to the PRIOR ART.

Referring now to FIGS. 4A-4E, a printed circuit board 10 in this example includes RF electrical components (not shown); here for example, Monolithic Microwave Integrated Circuits (MMICs) interconnected by microwave transmission lines 12, here stripline microwave transmission lines, having a signal strip conductor 14 on, and separated from, a pair of upper and lower ground plane conductors 16a, 16b by a dielectric structure 18 here having two members; an upper member 18a and a lower member 18b of the printed circuit board 10. The bottom ground plane conductor 16b is mounted, and electrically connected to, a portion of an upper surface 19 of an electrically conductive layer 20; here for example, an electrical and thermally conductive heat spreader, or cold plate, as shown. It is noted that a cutout 22 is formed in the printed circuit board 10 by removing an upper portion of the dielectric member 18a and portion of the upper ground plane conductor 16a to expose an end portion 17 of the transmission line strip conductor 14.

Figure 2A:
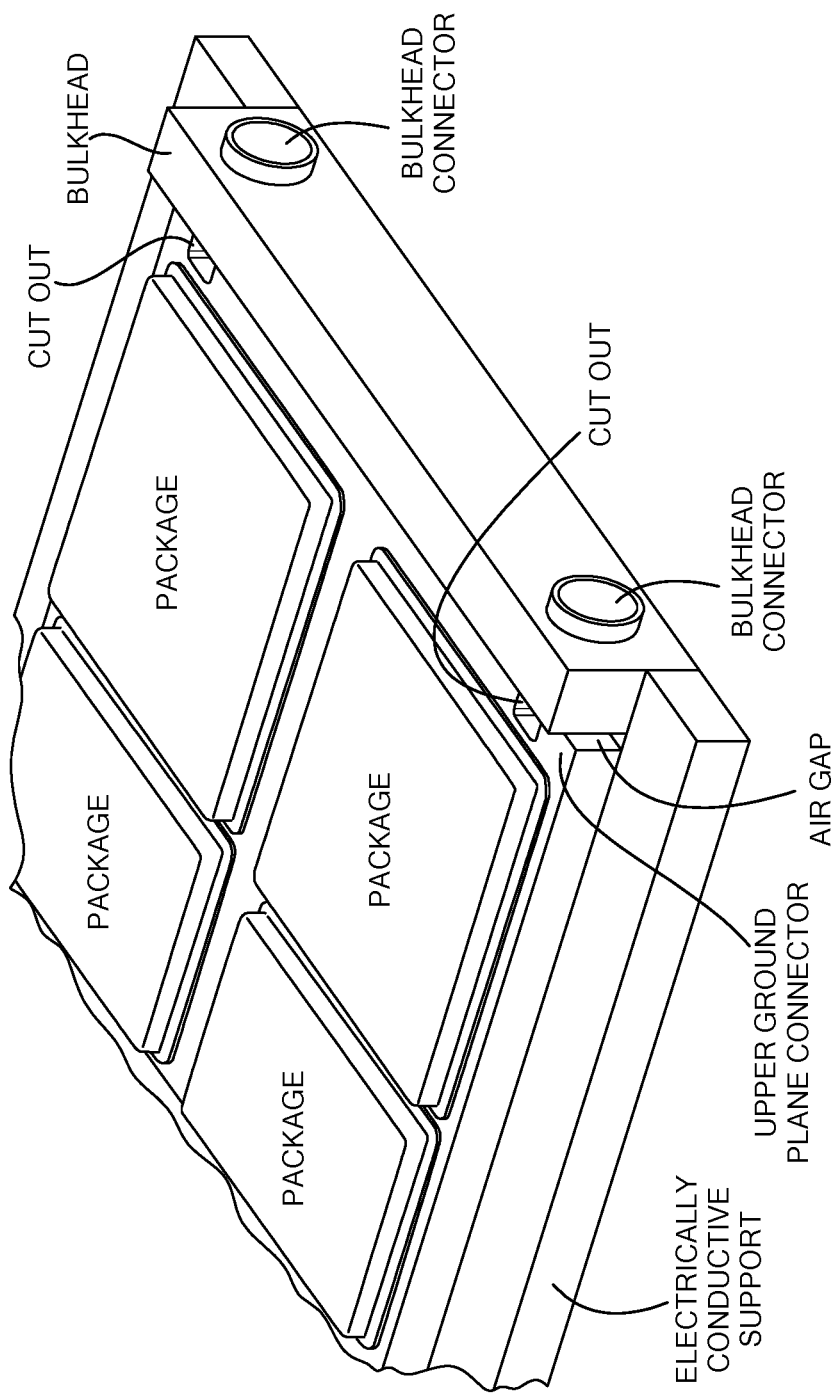
FIG. 2A is a perspective view of a portion of a chassis having a bulkhead electrical connector electrically connected to a microwave transmission line within the chassis according to the PRIOR ART.
Figure 2B:
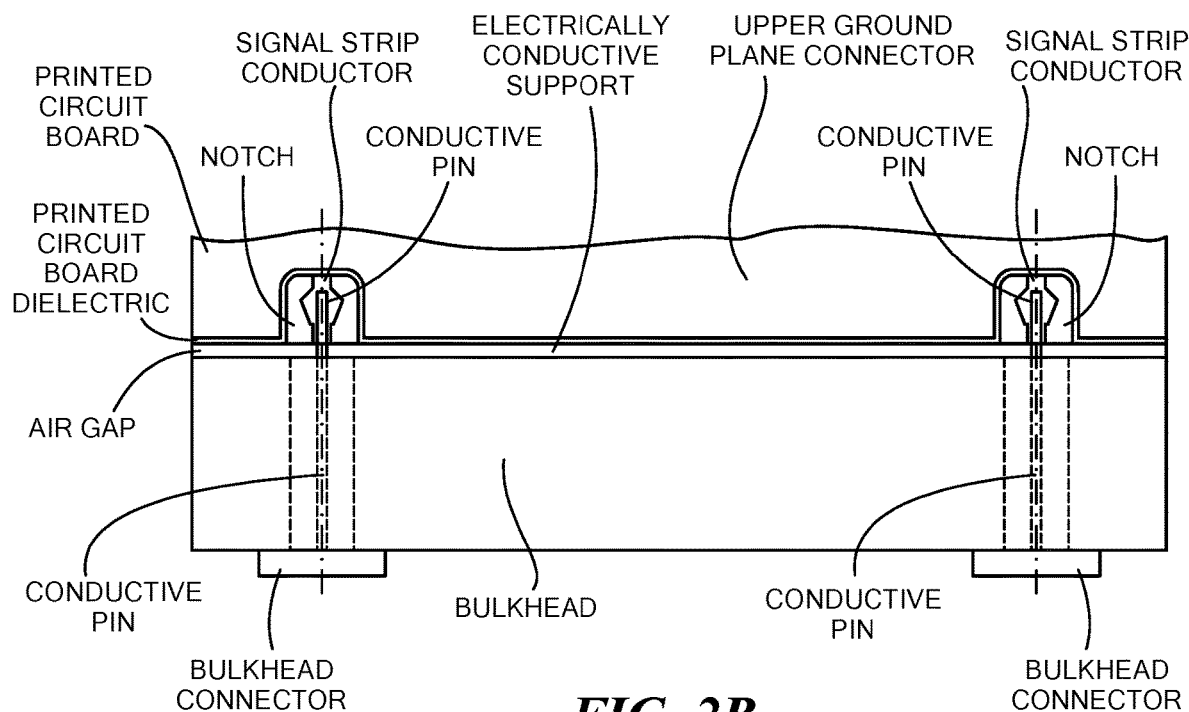
FIGS. 2B and 2C are top and cross sectional diagrammatical sketches, respectively, of the bulkhead connector of FIG. 2A electrically connected to the microwave transmission line of a printed circuit board of FIG. 2A according to the PRIOR ART.
Figure 2C:
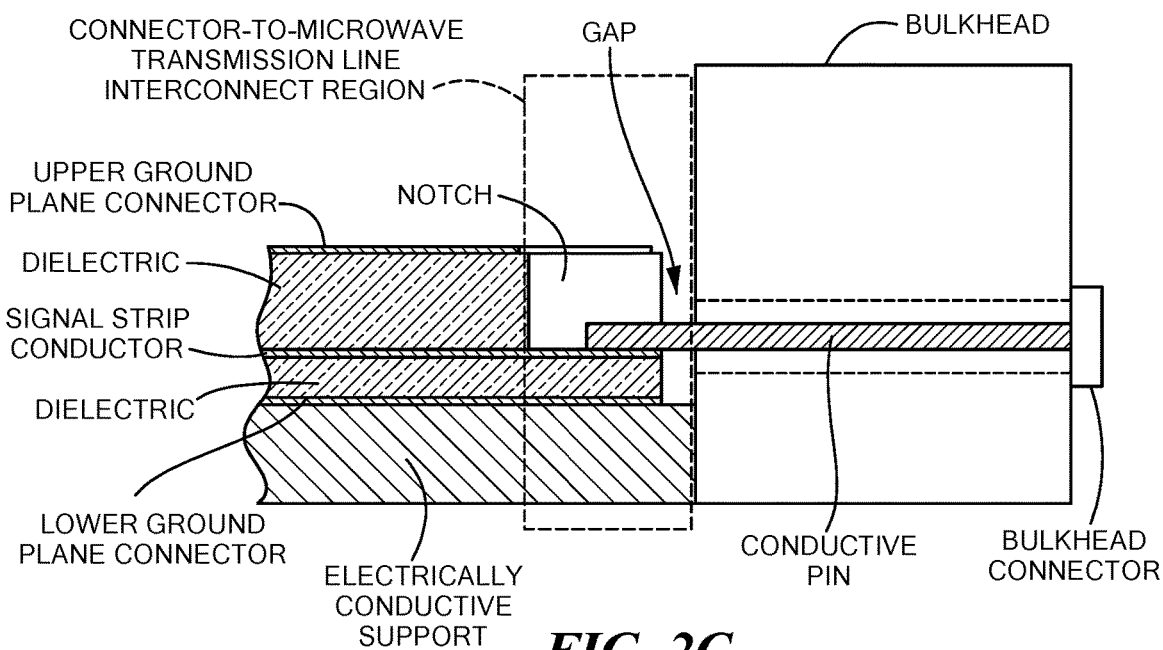
Figure 3A:
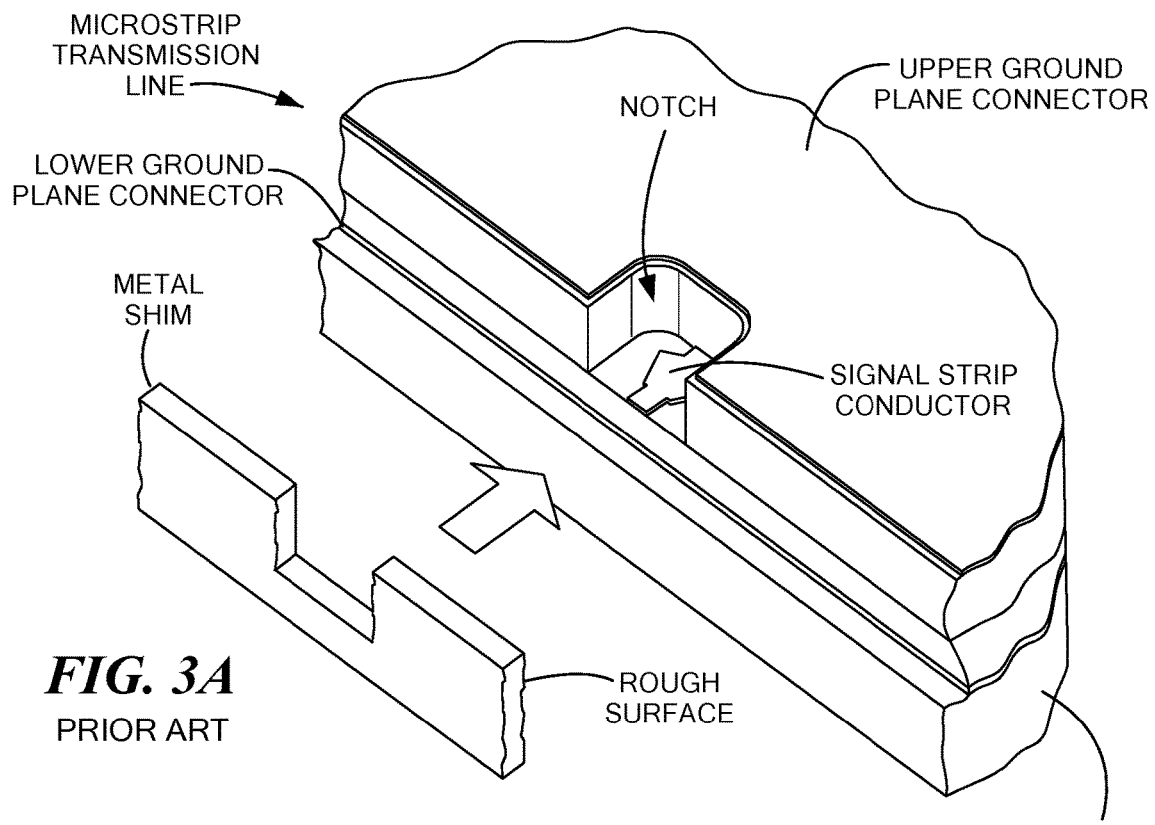
FIG. 3A is an exploded perspective sketch illustrating a method used to connect the bulkhead connector of FIG. 2B to the microwave transmission line of the printed circuit board of FIG. 2B at one stage in such method according to the PRIOR ART.
Figure 3B:
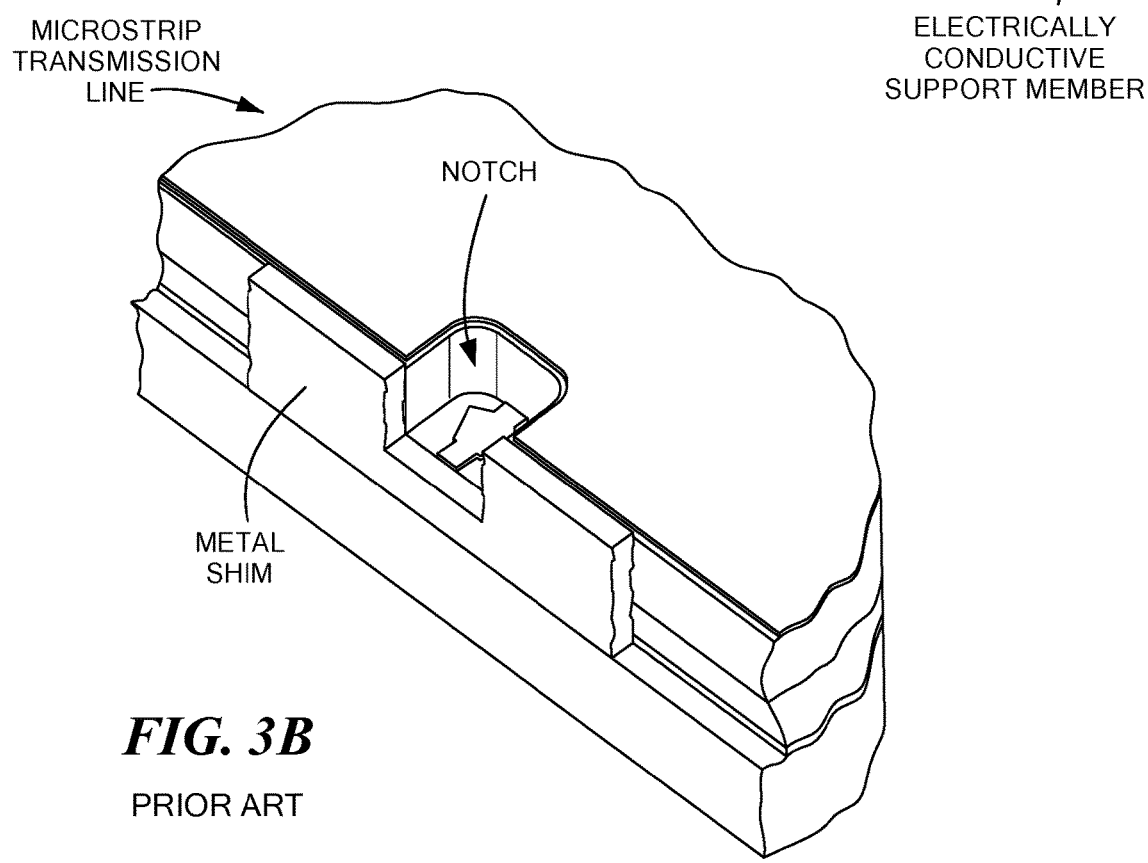
FIG. 3B is a perspective sketch showing the assembled structure of FIG. 3A according to the PRIOR ART.
Figure 3C:
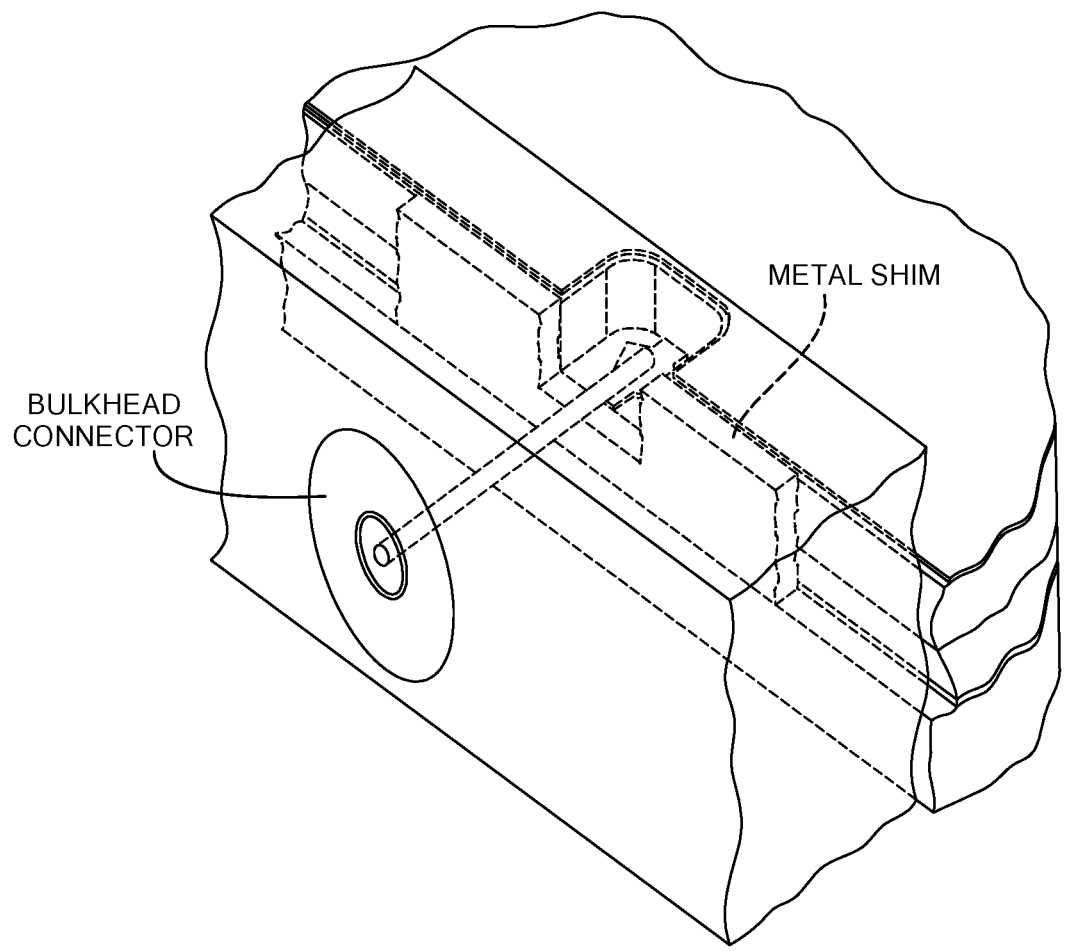
FIG. 3C is a perspective sketch showing the assembled structure of FIG. 3C connected to a bulkhead of the chassis of FIG. 3A according to the PRIOR ART.
Figure 3D:
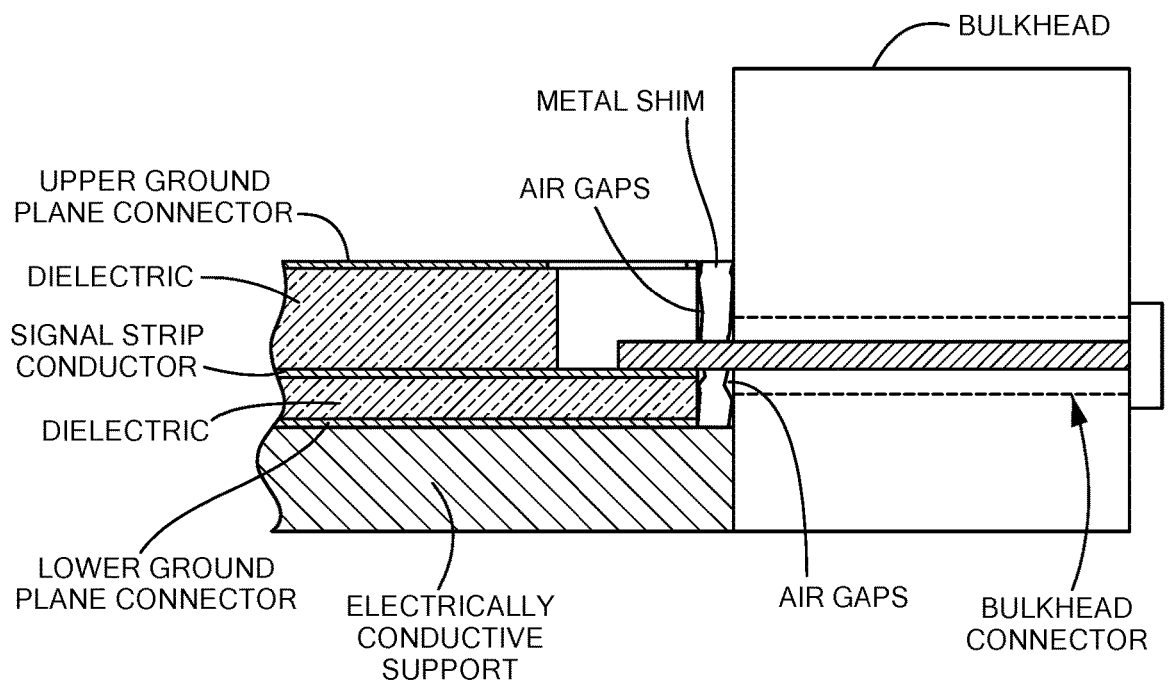
FIG. 3D is a cross-sectional sketch of the bulkhead connector of FIG. 2A electrically connected to the microwave transmission line of a printed circuit board of FIG. 2A after forming the assembled structure of FIG. 3C at a subsequent step in the method according to the PRIOR ART.
Figure 3E:
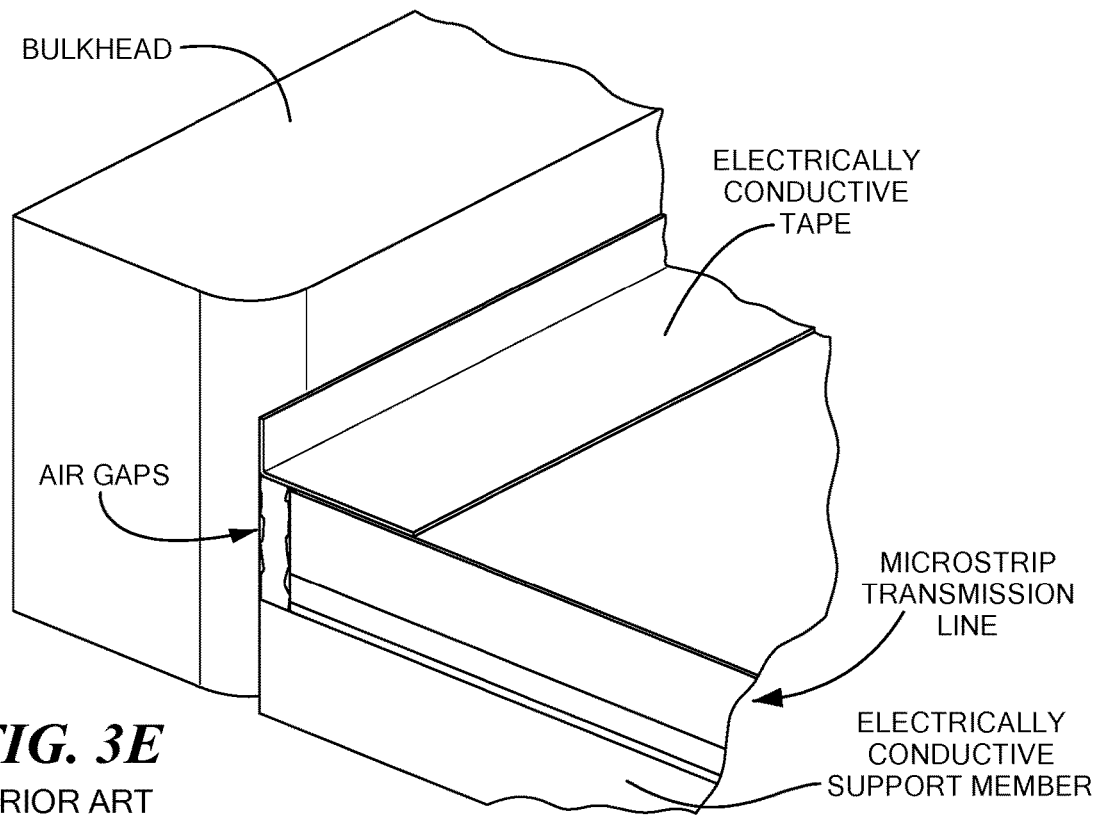
FIG. 3E is a cross sectional sketch of the bulkhead connector of FIG. 2A electrically connected to the microwave transmission line of a printed circuit board of FIG. 2A after forming the assembled structure of FIG. 3C at a subsequent step in the method according to another arrangement of the PRIOR ART.
Figure 4A:
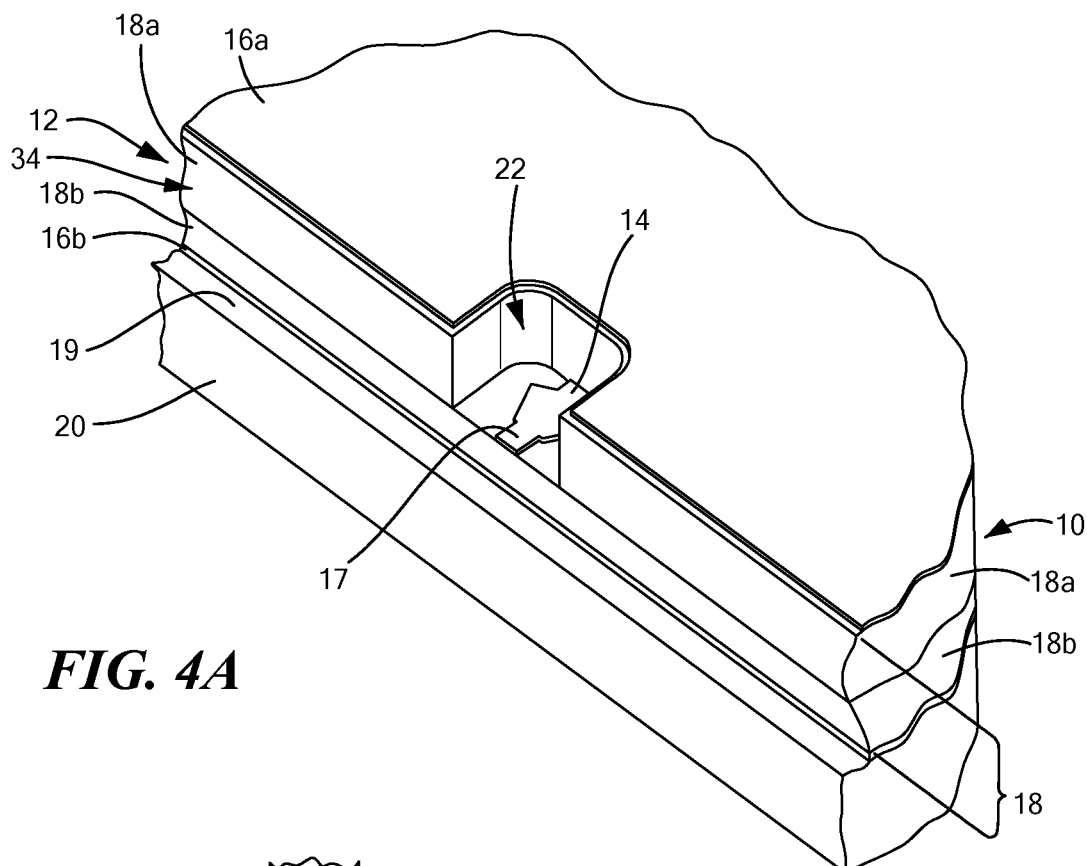
FIG. 4A is a diagrammatical perspective view sketch of printed circuit board mounted to an upper portion of a surface of an electrically conductive support, the printed circuit board and the and electrically conductive support providing a strip microwave transmission line abated for connected to a bulkhead of FIG. 3A in accordance with the disclosure.
Figure 4B:
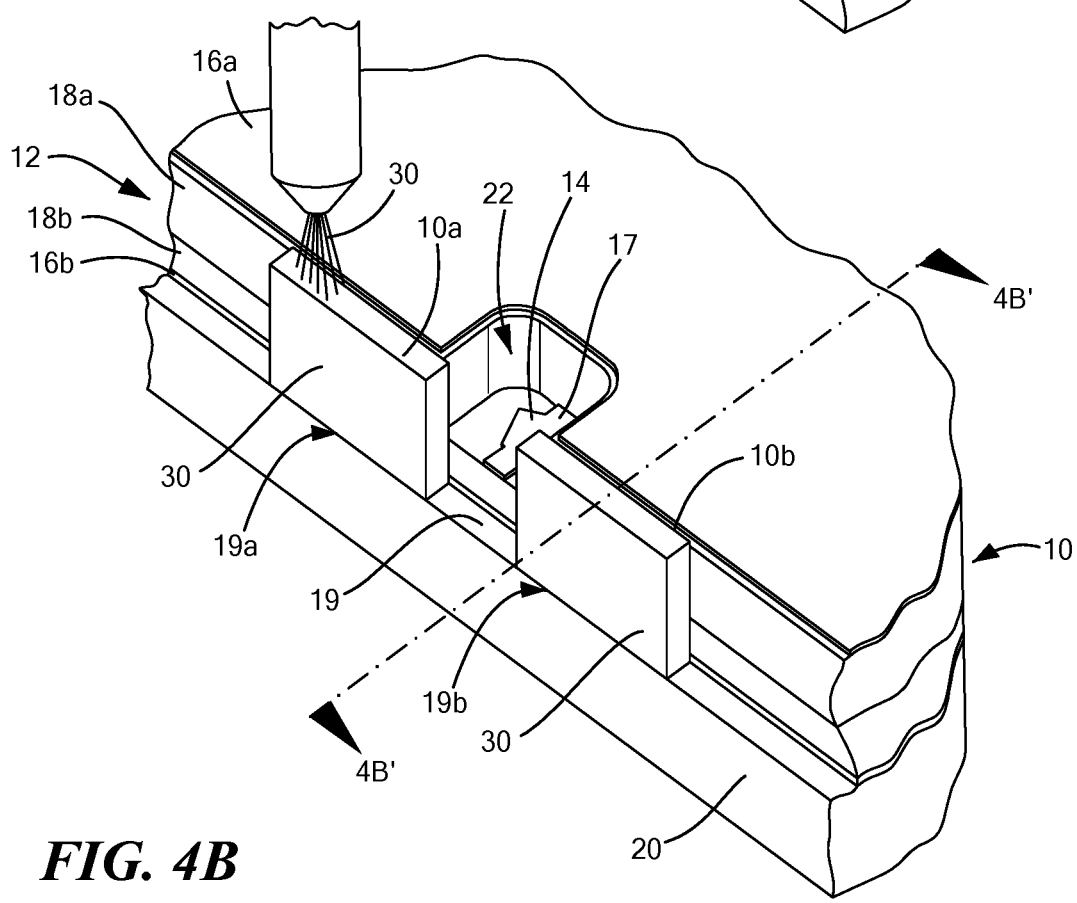
FIG. 4B is diagrammatical sketches of the printed circuit board of FIG. 4A after performing a first step in a method used to connected the bulkhead connector of FIG. 2A to the microwave transmission line of the printed circuit board of FIG. 4A according the disclosure.
Figure 4B:
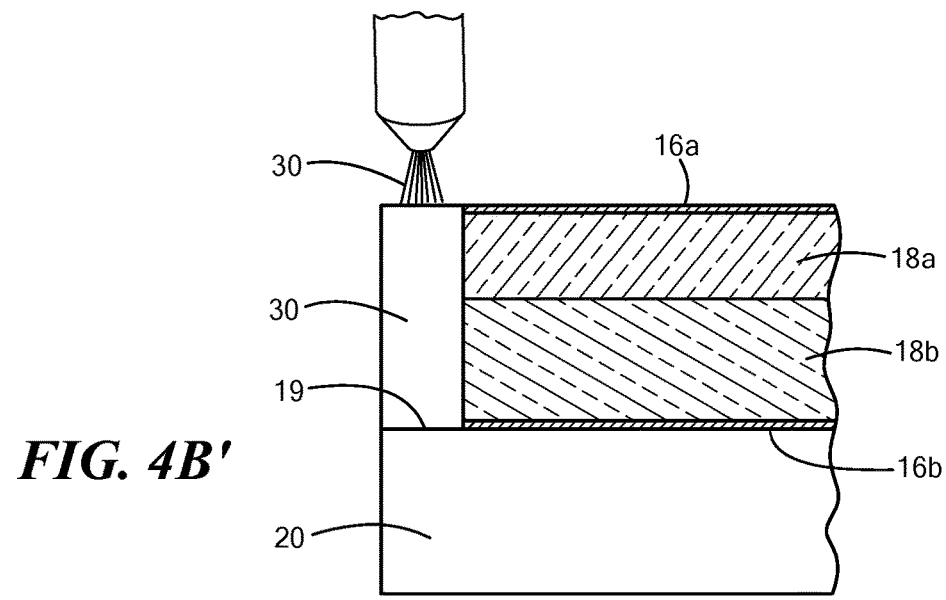
Figure 5:
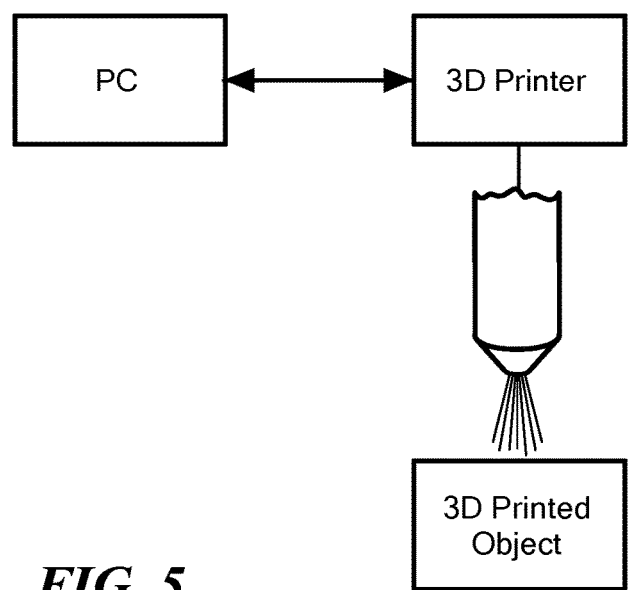
FIG. 5 is a block diagram of additive manufacturing equipment used in the method to connect a bulkhead connector to a to a microwave transmission line of the printed circuit board of FIGS. 4A-4E according the disclosure.
Figure 6A:
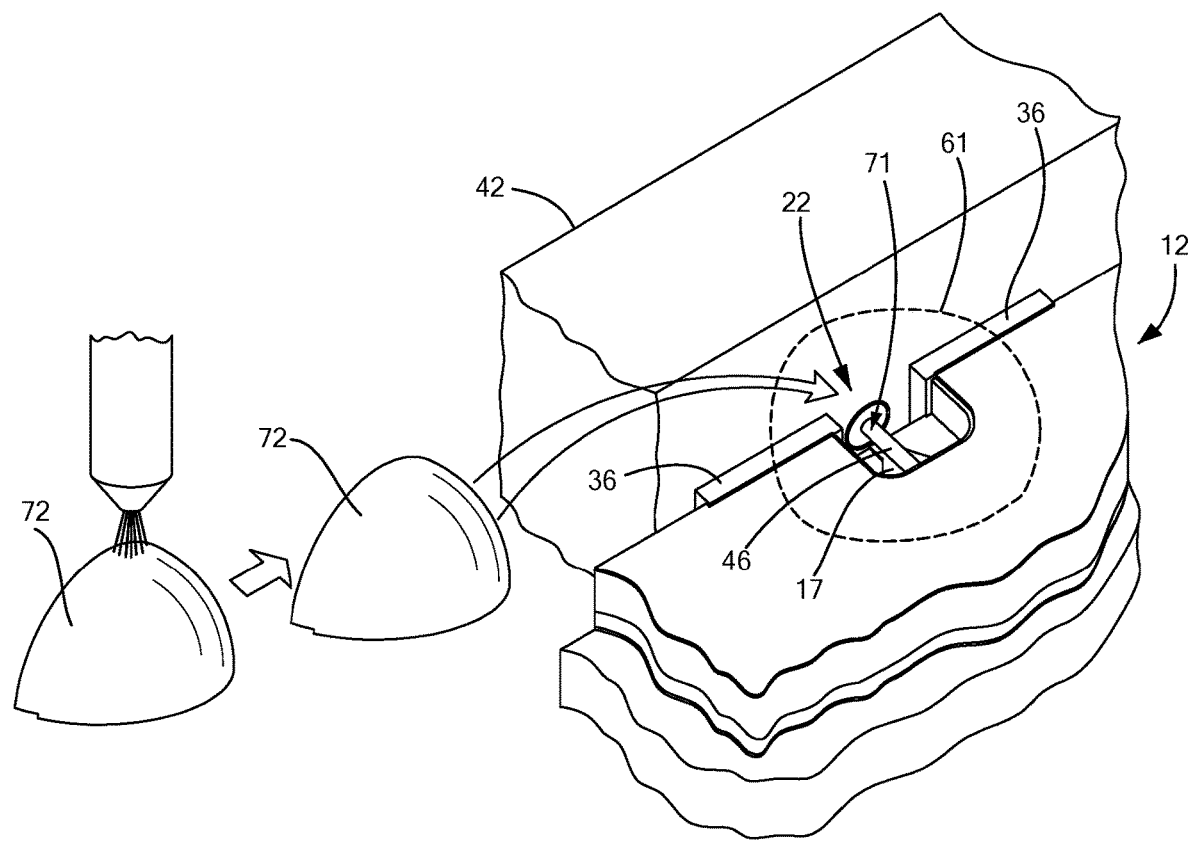
FIGS. 6A-6C are diagrammatical perspective sketches illustrating the formation and assembly of an electrically conductive shielding structure after formation of the structures shown in FIGS. 4C and 4D, such electrically conductive shielding structure being shown in the completed structure shown in FIG. 4E according to the disclosure.
Figure 6C:
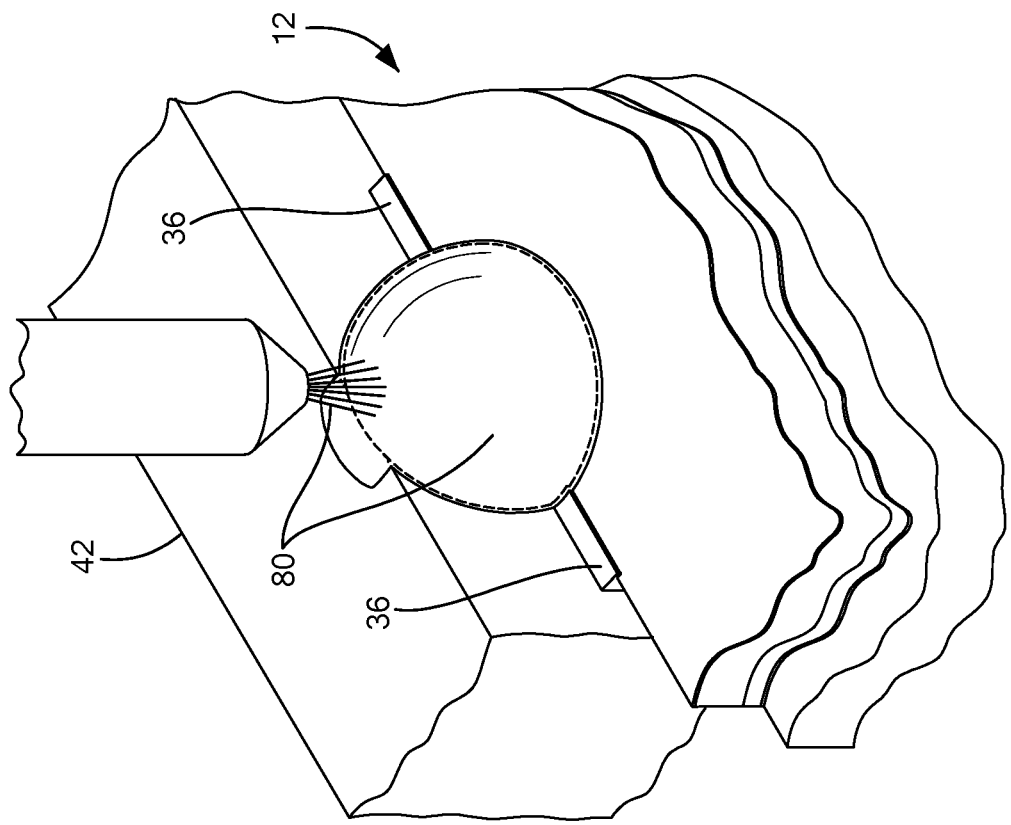
Figure 6B:
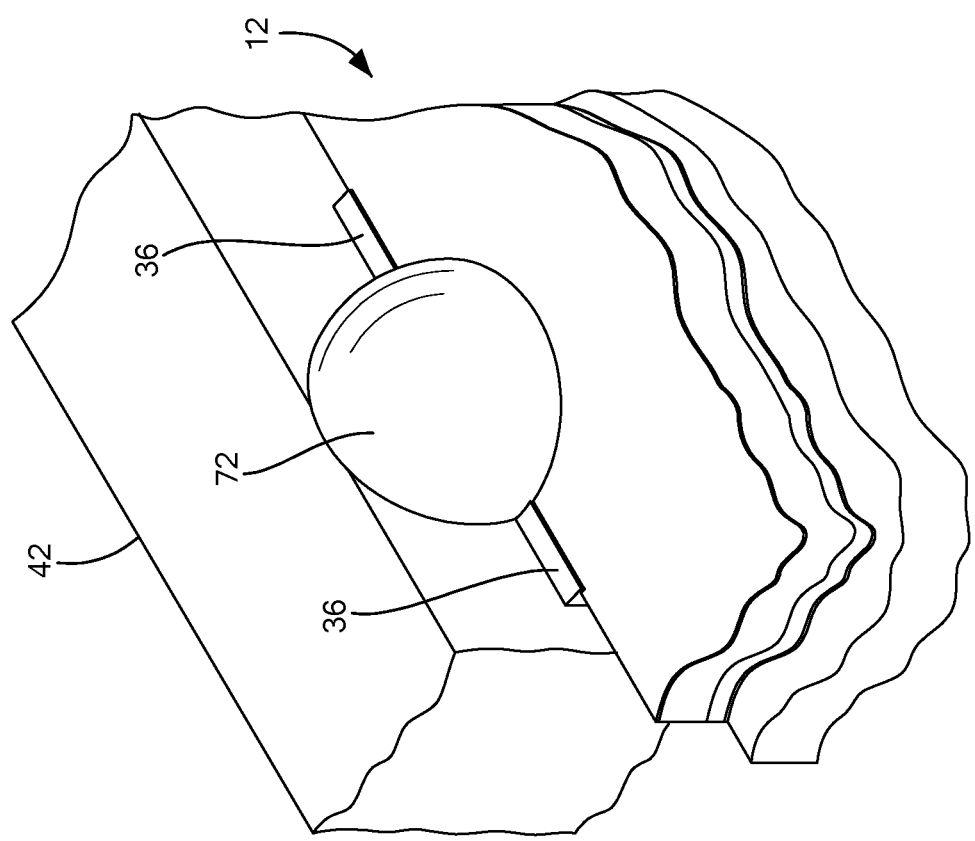

An elastic, dielectric 'pillow' material 30 (FIGS. 4B, 4B') having the Young's modulus being selected in a manner to be described in connection with FIGS. 6A and 6B is printed using additive manufacturing equipment shown in FIG. 5 to build up two spaced surface regions, 19a, 19b of the electrically conductive layer 20, as shown in FIGS. 4B, 4B' and on and against portions 10a, 10b of the front surfaces, or edges, of the printed board circuit board 10 where a gap 21 (FIG. 4D) would otherwise be formed (as described above in connection with FIG. 2C). The material 30, when applied is viscous and after curing becomes an elastic compliant material. Here for example, the material 30 is silicone.

To put it another way, because the front edges 10a, 10b of the printed circuit board 10 is set back from the front edge 20a of the conductive layer 20 (FIG. 4D), a gap 21 will be formed between the face 52 of a bulkhead 42 and the front edges 10a, 10b of the printed circuit board 10 when the face 52 abuts the front edge of 20a of the electrically conductive layer 20 (FIG. 4B). Thus, the dielectric 'pillow' material 30 (FIG. 4B) is inserted, here printed layer by layer, on the surface portions 19a, 19b of the electrically conductive layer 20 and on a portion of the pair of spaced front surfaces 10a, 10b (FIG. 4A) of the printed circuit board 10, as shown, such material 30 reaching the upper ground plane conductor 16a, as shown in FIG. 4B to thereby fill the gap 21.

Figure 4C:
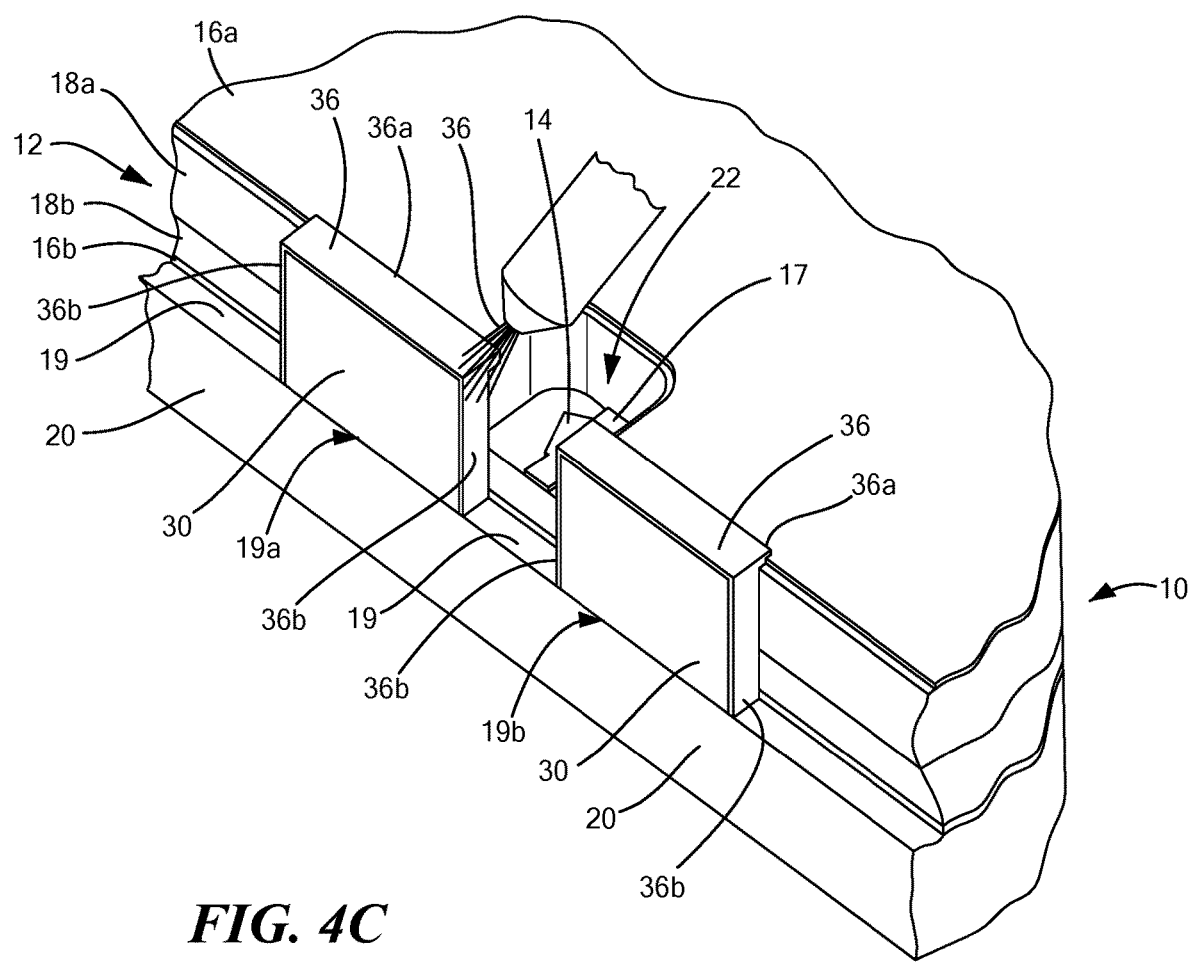
FIG. 4C is diagrammatical sketches of the printed circuit board of FIG. 4A after performing a second step in the method used to connected the bulkhead connector of FIG. 2A to the microwave transmission line of the printed circuit board of FIG. 4A according the disclosure.

Next, referring to FIG. 4C, an electrically conductive material 36, here for example an electrically conductive ink, here for example a silver conductive ink from Paru, Ltd. Korea is then printed on the vertical sides and upper surface of the elastic material 30, as shown, using additive manufacturing equipment shown in FIG. 5. It is noted that portions 36a of the electrically conductive material 36 is also deposited on adjacent portions of the upper ground plane conductor 16a and portions 36b of the electrically conductive material 36 deposited on the vertical sides of the elastic material 30 electrically connect the upper ground plane conductor 16a of the printed circuit board 10 to the electrically conductive layer 20 and thus connecting conductive material 30b to electrically conductive layer 20. It is noted that portions of the conductive material 36 are disposed on portions of the upper ground plane conductor 16a, as shown in FIG. 4C. Thus, the upper ground plane conductor 16a is connected to the conductive layer 20 through the conductor material portions 36a and 36b.

Figure 4D:
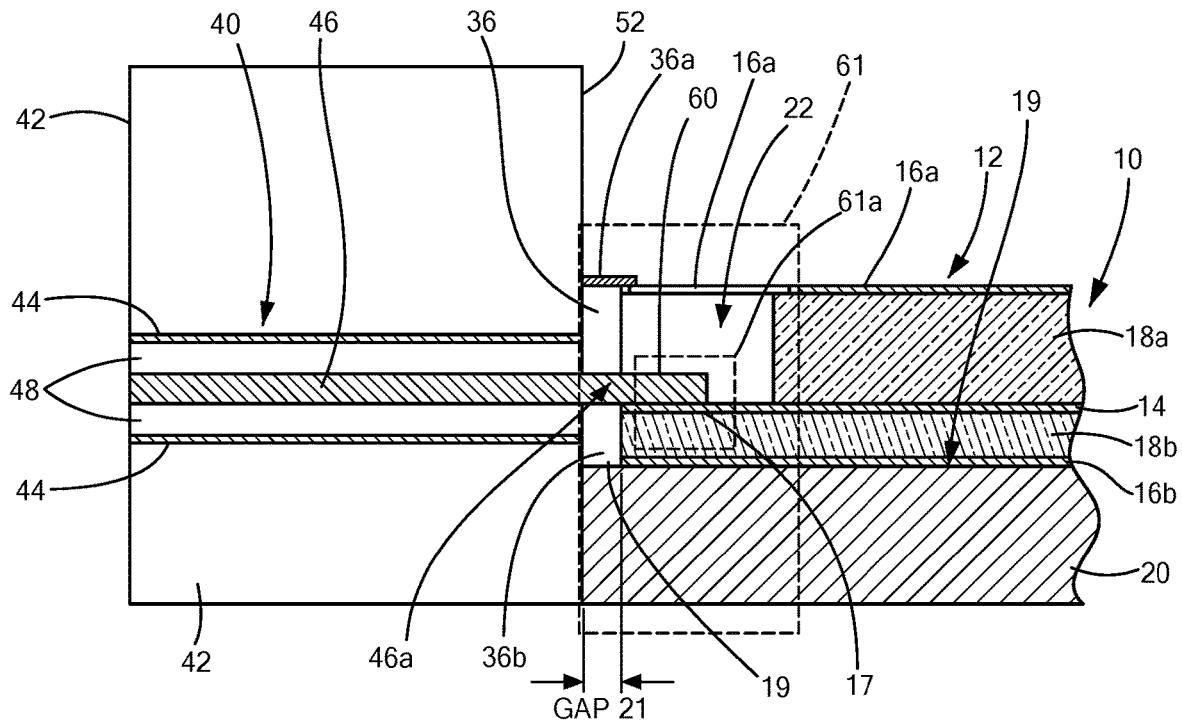
FIG. 4D is a cross sectional sketch of the structure formed in FIG. 4C connected to the bulkhead connector according to the disclosure.

Referring now to FIG. 4D, in order to interface with external components or power sources (not shown), a bulkhead connector 40, which passes through a bulkhead 42, is provided, as shown. More particularly, the bulkhead connector 40 is, in effect, a coaxial connector, which passes through the bulkhead 42 and has an outer conductor 44 mounted, and electrically connected to the bulkhead 42 with an inner electrically conductive pin 46, electrically insulated from the outer conductor 44 by suitable toroid shaped dielectric element 48. It is noted that the conductive pin 46 has an end portion 60 projecting outwardly from one side 52 (FIG. 4D) of the bulkhead 42 for positioning on, and electrical connection with, an end portion 17 of the strip conductor 14 (FIG. 4B) of the microwave transmission line 12 at an interconnect region 61a. It is also noted that there is an intermediate portion 46a of the pin 46 that extends from the surface 52 of the bulkhead 42 to the interconnect region 61a passes through the gap 21 and passes between the electrical coated sides 36b of the material 30 as shown in FIG. 6A and over the portion of an upper surface 19 of an electrically conductive layer 20. Thus, there the conductive material 36b on the vertical sides of the material 30 to provide electrical shielding to the vertical sides of the intermediate portion 46a of the pin 46, the portion of the 20 on the bottom of the gap 21 provides electrical shielding to the bottom of the intermediate portion 46a of the pin 46 in the region between the surface 52 of the bulkhead 42 and the interconnect region 61a, and the material 36a on the top of material 30 provides an electrical shield over the top portion of the intermediate portion 46a of the pin 46. Thus, intermediate portion 46a of the pin 46 is completely circumferentially surrounded by portions of the electrically conductive materials 30, 20 to provide an electrical shield for the intermediate portion 46a of the pin 46.

The following process is used to connect the exposed end portion 17 of the transmission line strip conductor 14 to the end portion 60 of the conductive pin 46 of the bulkhead connector 40:

The bulkhead 42 is screwed down next to the printed circuit board 10 by any convenient means, not shown, with the electrically conductive coated "pillow" material 30 being pushed against the opposing surface of the electrically conductive layer 20. Next, the exposed end portion 17 of the transmission line strip conductor 14 is connected to the end portion 60 of the conductive pin 46 of the bulkhead connector 40 in a connector-to-microwave transmission line interconnect region 61 (FIG. 4D). It is noted that the exposed end portion 17 of the transmission line strip conductor 14 may be soldered to the end portion 60 of the conductive pin 46 of the bulkhead connector 40.

Figure 4E:
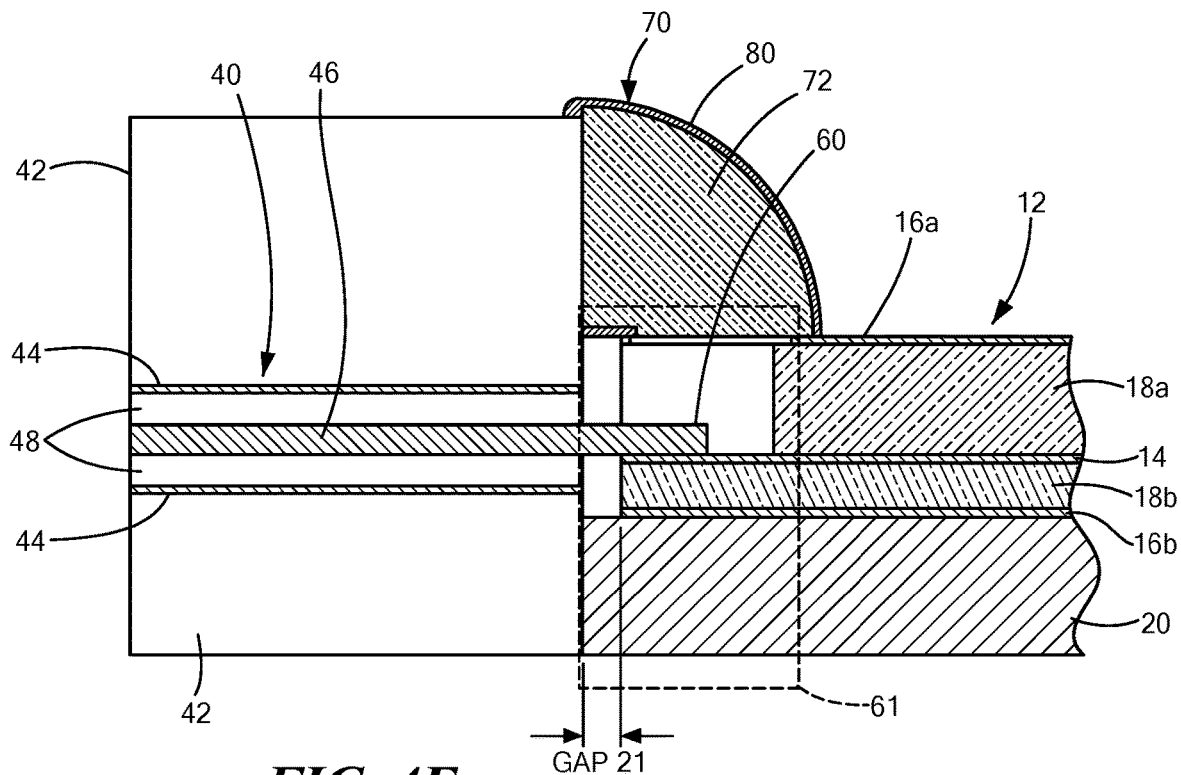
FIG. 4E is a cross sectional sketch of the structure formed in FIG. 4B connected to the bulkhead connector after completion of the method according to the disclosure.

Next, referring to FIG. 4E an electrically conductive roof or shielding structure 70, formed in a manner to be described next in connection with FIGS. 6A-6C, is disposed over the interconnect coupling region 61. While the fabrication and assembly of the electrically conductive shield 70 will be described in connection with FIGS. 6A-6C, here, in this example, the electrically conductive shielding structure 70 includes: a dielectric quarter sphere shaped dielectric support structure 72 (FIG. 4E), here the Young's modulus being selected in a manner described below, formed, in this example, separately, as a self-supporting structure, using, in this example, the additive manufacturing system in FIG. 4, here the dielectric material of the dielectric support structure 72 is the same material as the dielectric "pillow" material 30; and an electrically conductive material 80, here a conductive ink (here for example, a silver conductive ink from Paru, Ltd. Korea), is disposed on, to thereby coat) an outer surface of the dielectric support structure 72 to form a continuous electrically conductive layer over the entire outer surface of the dielectric support structure 72, as shown in FIG. 4E. It is also noted that a portion of the electrically conductive material 80, is deposited on the bulkhead 42 in those regions where the dielectric support structure 72 is extends beyond the bulkhead 42 to insure that not only those portions of the coated dielectric support structure 72 having edges in physical contact with the bulkhead 42 are in both physical and hence electrical contact with each other but also that the entire outer conductor material 80 is in electrical contact with the bulkhead 42, as shown in FIG. 4E.

More particularly, and referring to FIGS. 6A-6C, after forming the dielectric support structure 72, in this example as a self-supporting structure using additive manufacture here using the apparatus of FIG. 5, the dielectric structure 72 is positioned over the connection-to-microwave transmission line interconnect region 61 (FIG. 6A) using, for example, "pick and place" equipment, not shown, and then affixed by any conventional dielectric adhesive material, not shown, to the upper conductive ground plane 16a of the printed circuit, against the bulkhead 42, and on the portions of the conductive material 32 on the elastic material 30 described above in connection with FIG. 4A-4C and onto portion of the bulkhead 42. It should be is understood that alternate geometries may be used instead for the dielectric support structure 72. It is noted that while here the dielectric support structure 72 is here self-supporting; the dielectric support structure 72 need not be self-supporting but may be printed in situ, using additive manufacturing and the system of FIG. 5 and then coated with the electrically conductive material 80 to form a continuous electrically conductive layer over the entire outer surface of the dielectric support structure 72, as shown in FIG. 4E with portions being deposited on portions of the bulkhead 42 as described above, as shown in FIG. 4E. The method selected would be material and application dependent. Thus, the quarter sphere of the dielectric support structure 72 may be formed in situ, rather than using "pick and place" as described above.

It should be noted that the dielectric support structure 72 is an elastic material. More particularly, the Young's modulus of the "pillow" material 30 and the dielectric quarter sphere shaped dielectric support structure 72 (here for example they are the same material) are selected in a manner so that the "pillow" material 30 and the dielectric; support structure 72 handle mismatched Thermal Coefficient of Expansions (TCEs) over the thermal range of interest, as for example, a silicone material. More particularly, for a given structure adapted for operation over a temperature operating range $T_{OP}$ and a storage temperature range $T_{SR}$, the "pillow" material 30 and the dielectric support structure 72 have a Young's modulus selected, over the temperature range of both the temperature operating range $T_{OP}$ and a storage temperature range $T_{SR}$ of the structure neither the interconnect between the end portion 60 of the pin 46 (FIG. 4B) and the end portion 17 of the transmission line strip conductor 14 fails, fractures or otherwise loses electrical connectivity. To put it another way, the Young's modulus of the "pillow" material 30 and the dielectric quarter sphere shaped dielectric support structure 72 and conductive material 80 are selected such that the "pillow" material 30 and the electrically conductive shield 70 will yield and not result in fractures or otherwise loses electrical connectivity because of expansions caused by mismatches between the coefficients of thermal expansion of the pillow material 30, printed circuit board 10 and bulkhead connector. Other materials may be used for the "pillow" material 30 and dielectric support structure 72 depending upon the application including composite dielectrics for example, Acrylonitrile Butadiene Styrene (ABS) or Polycarbonate quarter domes attached with more compliant materials such as silicone.

More particularly, referring to FIGS. 6B and 6C a conductive ink is used to form the conductive layer 80 by printing the conductive ink on the outer surfaces of the dielectric support structure 72 to thereby form the electrically conductive shielding structure 70; it being noted that, referring also to FIG. 4E, that the conductive ink forming conductive layer 80 is also printed onto the upper ground plane conductor 16a of the printed circuit board 10, onto portions of the bulkhead 42 (FIG. 4E) and onto portions of the conductive material 36 (FIG. 6C). This process, using the electrically coated "pillows" 30, and the electrically conductive shielding structure 70, both of which are electrically connected together and electrically connected to the bulkhead 42 and to the upper ground plane conductor 16a, with the electrically conductive shielding structure 70 being disposed over the connector-to-microwave transmission line interconnect region 61 (FIG. 4D effectively provides a complete electrical enclosing shield for the connector-to-microwave transmission line region 61 (FIG. 4E) including over outer end portion 60 of the conductive pin 46 of the bulkhead connector 40 and the outer portion 17 portion of the interconnect region 61 eliminating RF energy leakage.

Thus, an assembly (FIG. 4D) is provided having: a transmission line 10, comprising: a dielectric structure 18 (FIG. 4A), here having dielectric members 18a, 18b; a signal strip conductor 14 disposed on an upper surface of the dielectric structure 18a; and a ground conductor 16b disposed on the dielectric members 18a, 18b; a connector 40 comprising: an electrically conductive housing, in this embodiment, bulkhead 42, electrically connected to the ground conductor 16b through conductive layer 20; and a conductive pin 46 dielectrically separated from the conductive bulkhead 42, the conductive pin 46 having an end portion projecting outwardly from the bulkhead surface 52 onto, and electrically connected to, an upper portion of the signal strip conductor 14 at an interconnect region 61a; wherein the electrically conductive bulkhead surface 52 and the dielectric members 18a, 18b are separated by the gap 21; wherein an intermediate portion 46a of the conductive pin 46 extending from the bulkhead surface 52 to the interconnect region 61 is disposed in the gap 21 between the electrically conductive bulkhead surface 52 and the dielectric members 18a, 18b and therefore over a portion of the elastic material 30 in the gap 21; and an dielectric, elastic material 30 disposed in the gap 21, such dielectric elastic material 30 having a conductive layer 36 disposed on an outer surface and electrically connected to the ground conductor 16a, 16b to provide electrical shielding to the intermediate portion 46a of the conductive pin 46 disposed in the gap 21 and extending from the bulkhead surface 52 to the interconnect region 61, 61a. Further, the dielectric, elastic material 30 has a Young's modulus selected, over a predetermined temperature range of both a temperature operating range $T_{OP}$ of the assembly and a storage temperature range $T_{SR}$ of the assembly to prevent the signal strip conductor 14 and the pin 48 from being becoming electrically disconnected. Still further, the assembly includes an electrically conductive shield 70 (FIG. 4E) comprising: a dielectric support structure 72; and an electrically conductive layer 80 disposed on an outer surface of the dielectric members 18a, 18b, the electrically conductive shield 70 being disposed over the gap 21.

Figure 7A:
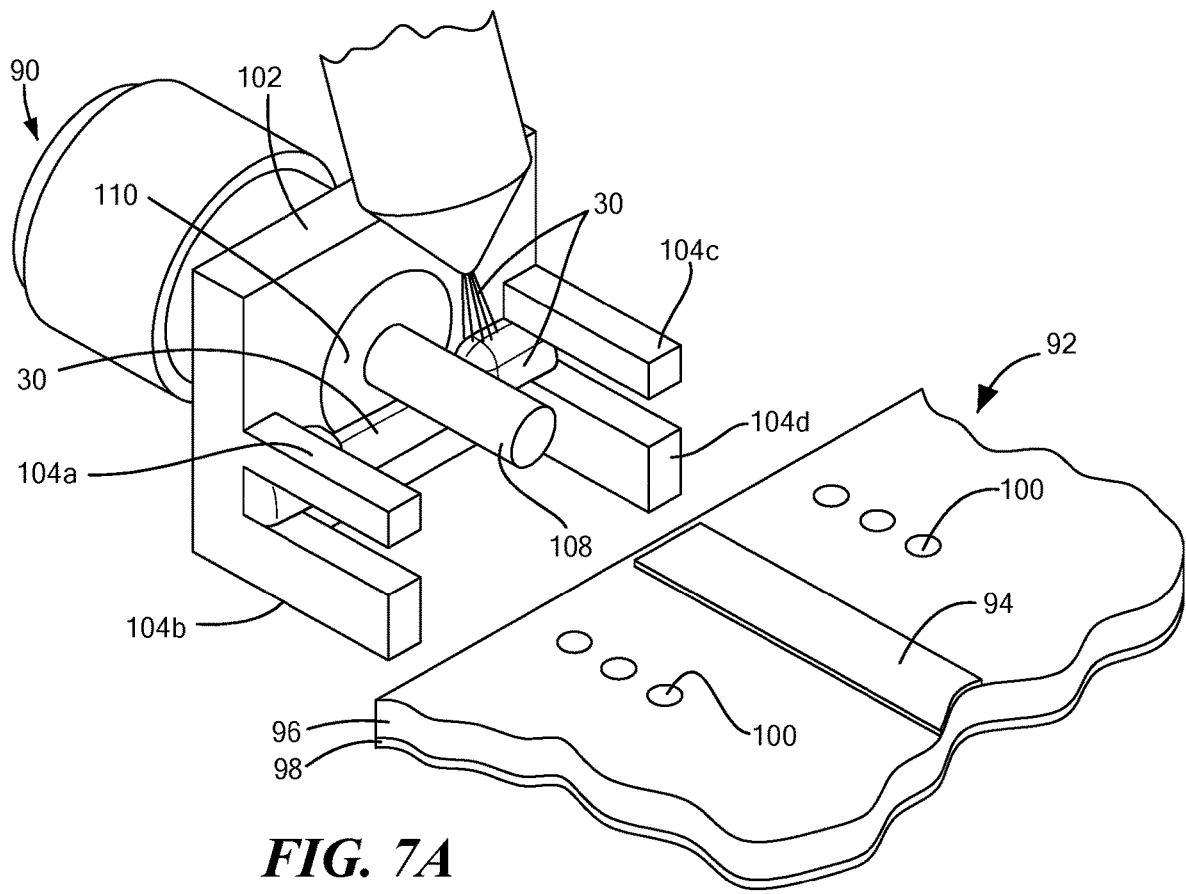
FIGS. 7A-7L is a series of perspective, cross sectional, and enlarged views of a method of providing connecting an electrical connector to a microwave transmission line of a printed circuit board using an electrically conductive shielding structure according to an alternative embodiment of the disclosure.
Figure 7B:
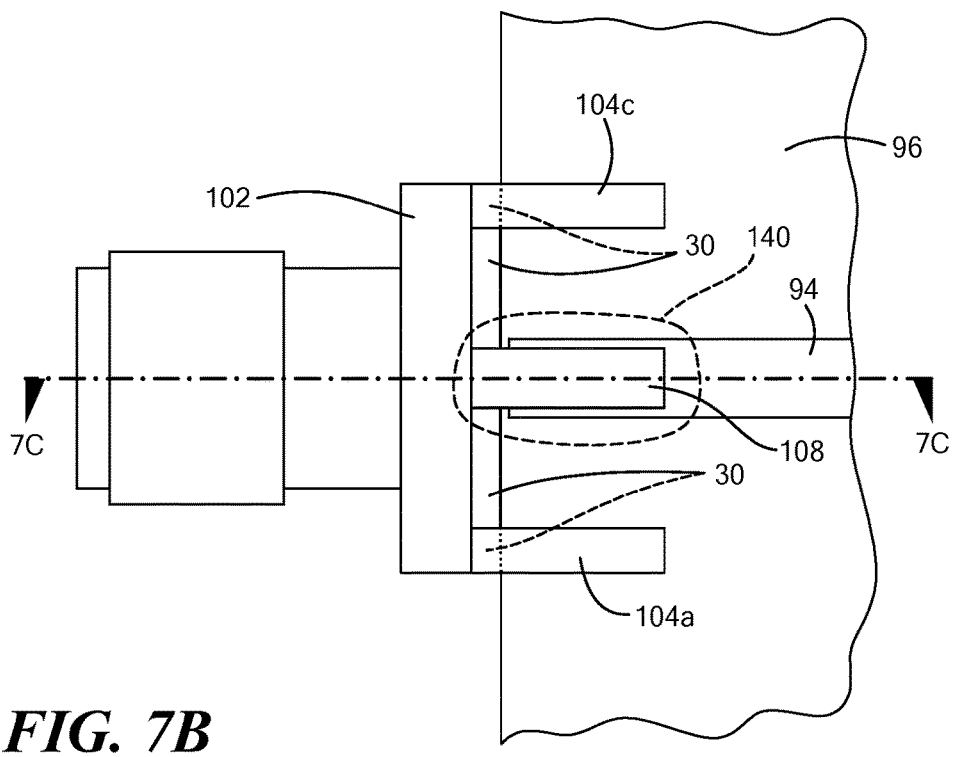
Figure 7C:
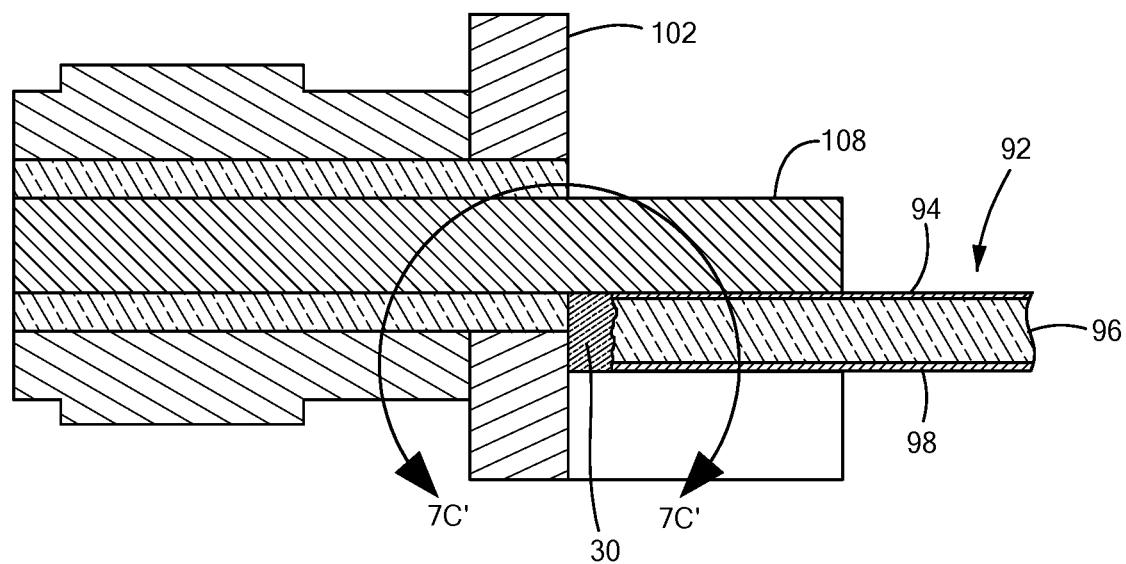
Figure 7C:
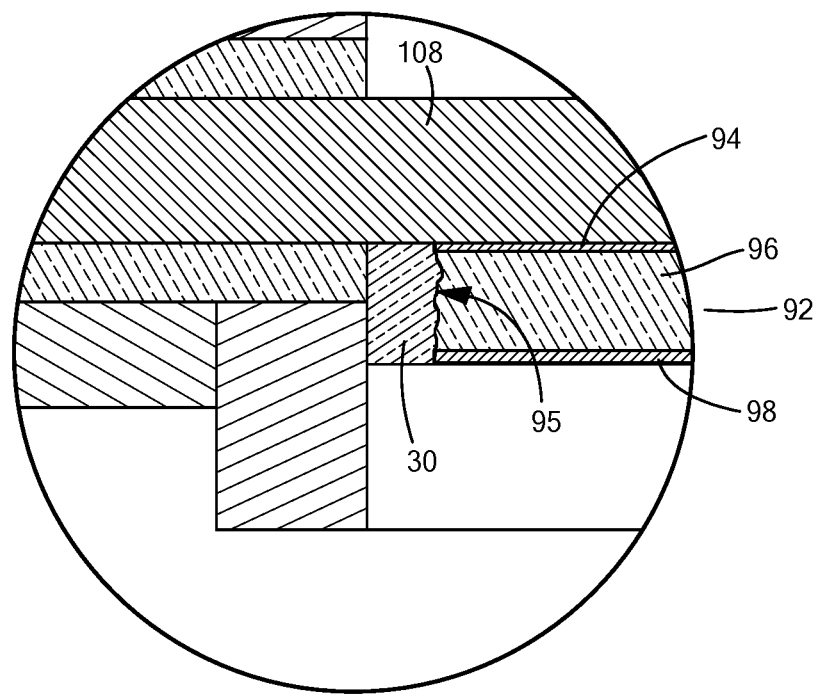

Referring now to FIGS. 7A-7L, including FIG. 7C', here, a connector 90 is shown for connection to a printed circuit board 92 having a strip transmission line; the strip transmission line having a signal strip conductor 94 on an upper surface of a dielectric member 96 and separated from a ground plane conductor 98 on the bottom surface of the dielectric member 96; the ground plane conductor 98 being electrically connected to electrically conductive vias 100 passing through the dielectric member 96, as shown. The connector 90 has an electrically conductive mounting flange 102 with two pairs of upper and lower electrically conductive arms 104a, 104b and 104c, 104d, respectively as shown projecting outwardly from the flange 102. The connector 90 has an electrically conductive pin 108 passing through the flange 102, such in pin 108 being electrically insulated from the flange 108 by a dielectric structure 110, as shown.

Figure 7D:
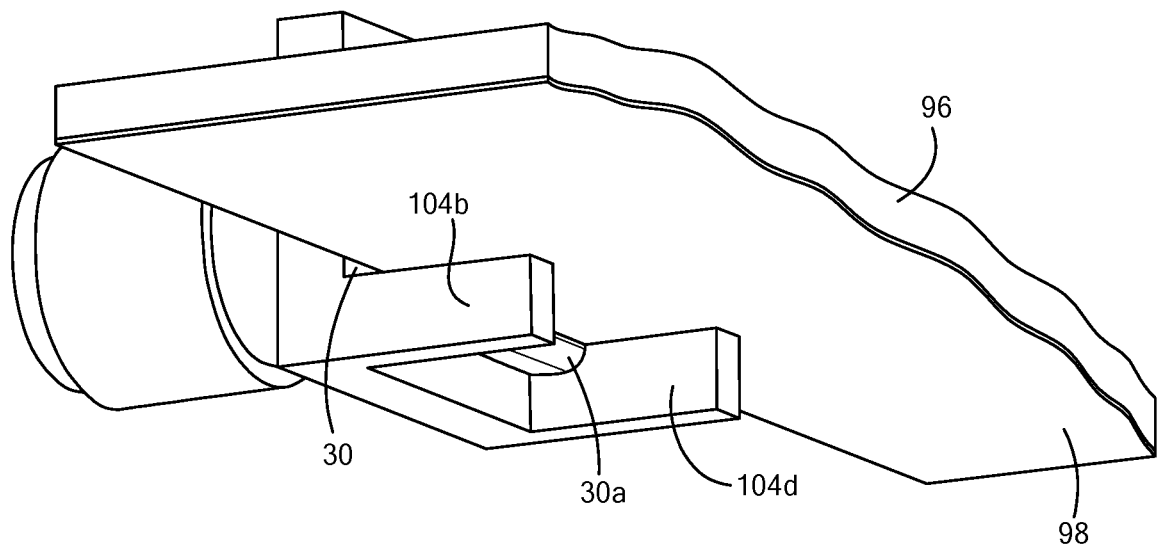
Figure 7E:
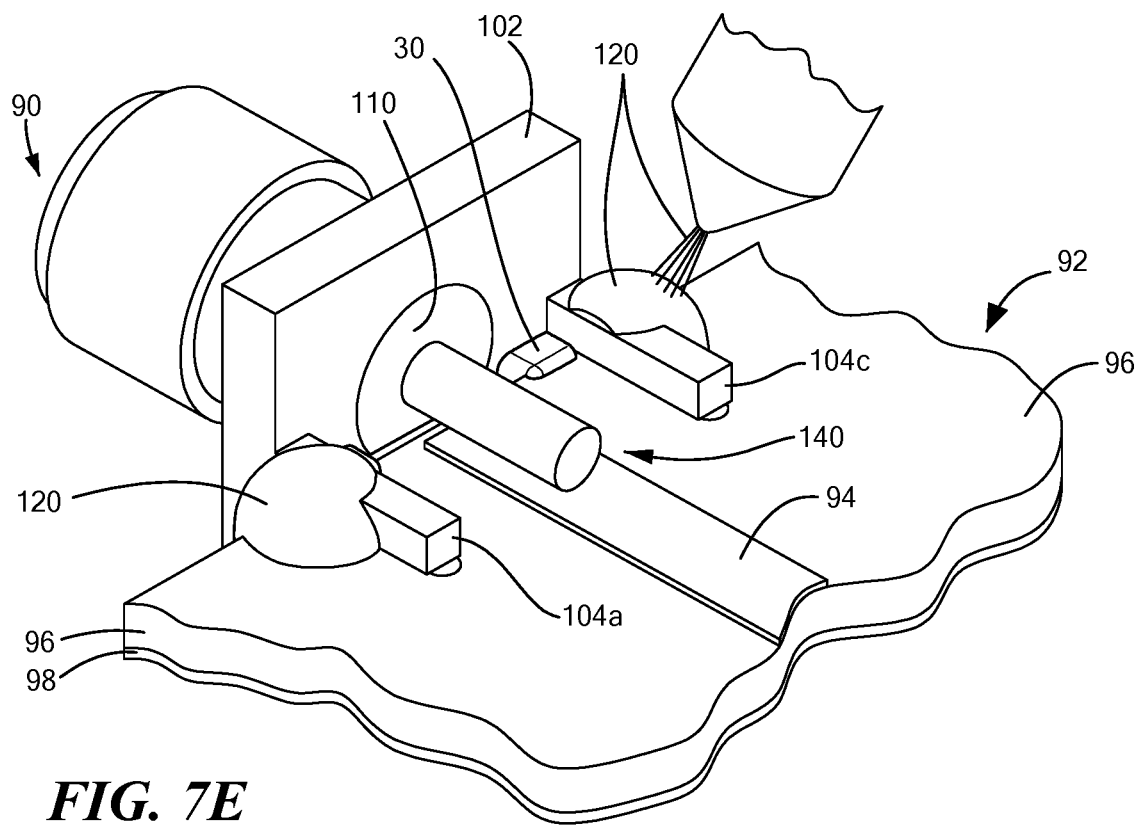
Figure 7F:
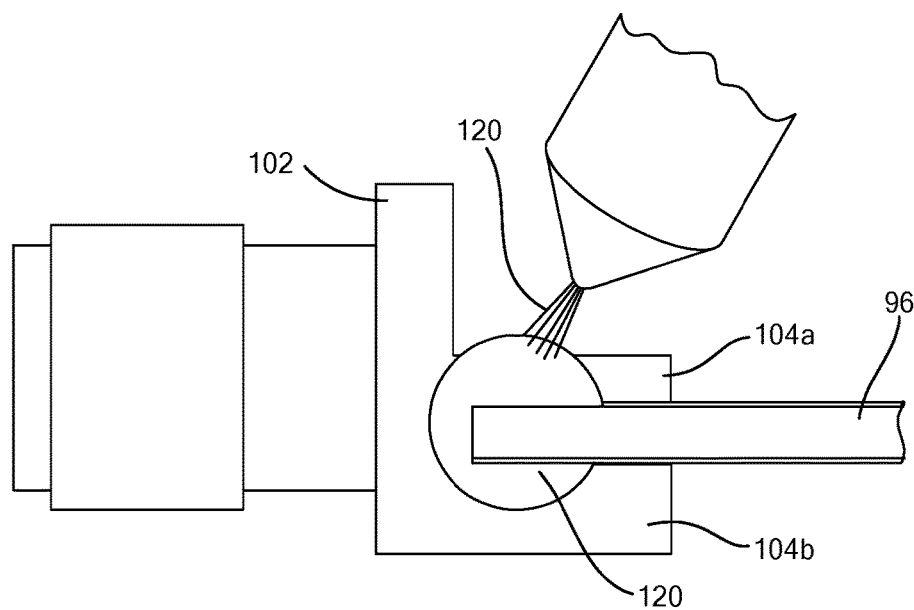

The elastic, dielectric 'pillow' material 30 described above, is formed, here using additive manufacturing (FIG. 5), on the inner portion of the flange 102 beneath the pin 108, and on the upper surfaces of the lower arms 104*b* and 104*c*, as shown in FIGS. 7A-7D. The forward end of the printed circuit board 92 and the connector 90 are urged one against the other with the boards 92 being slipped between the arms 104*a*, 104*b* and 104*c*, 104*d*, as shown in FIG. 7B. It is also noted that during this process the elastic, dielectric 'pillow' material 30 being elastic fills in any air gaps that results at the interface between the non-flat (irregular) front edge 95 (FIG. 7C') of the dielectric member 96 of the printed circuit board 92 and the flange 102 (FIG. 7C). The pin 108 is then soldered to the end of the signal strip conductor 94 and the lower surfaces of the upper arms 104*a*, 104*c* are soldered to the upper surfaces of the conductive vias 100. It is noted that a bottom portion 30*a* of the pillow ad material 30 is exposed in a region at the interface beaten the printed circuit board 92 and the flange 102, as shown in FIG. 7B-7D.

Figure 7G:
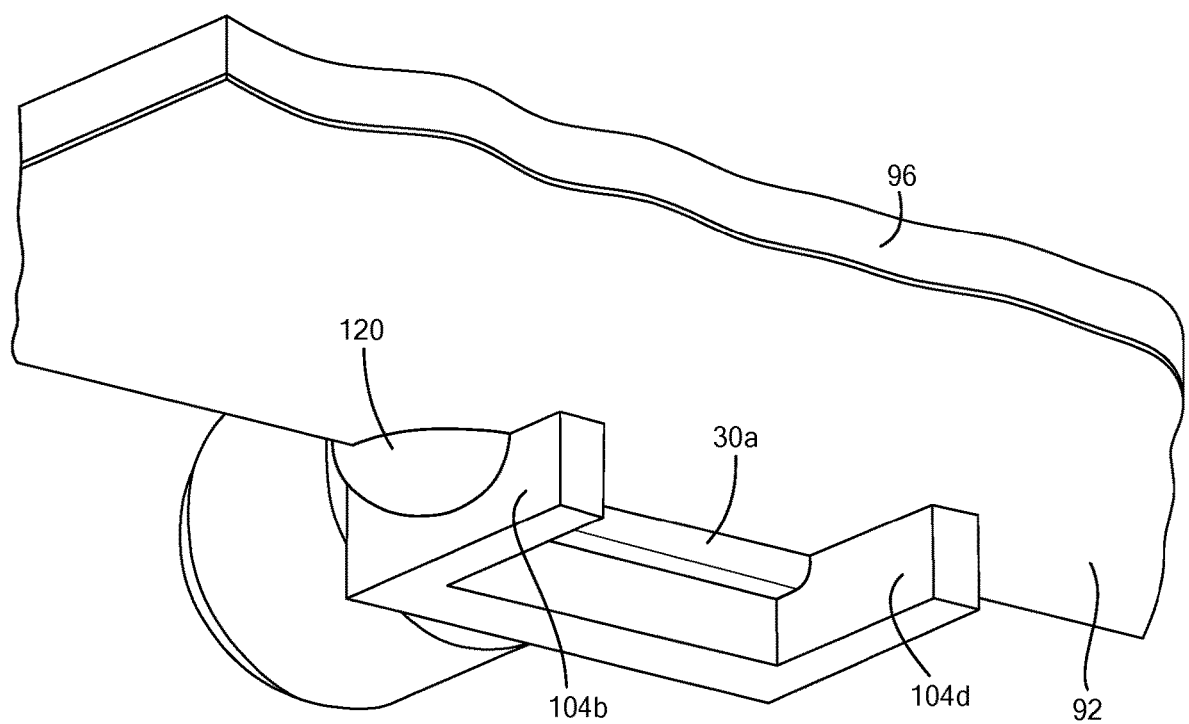
Figure 7H:
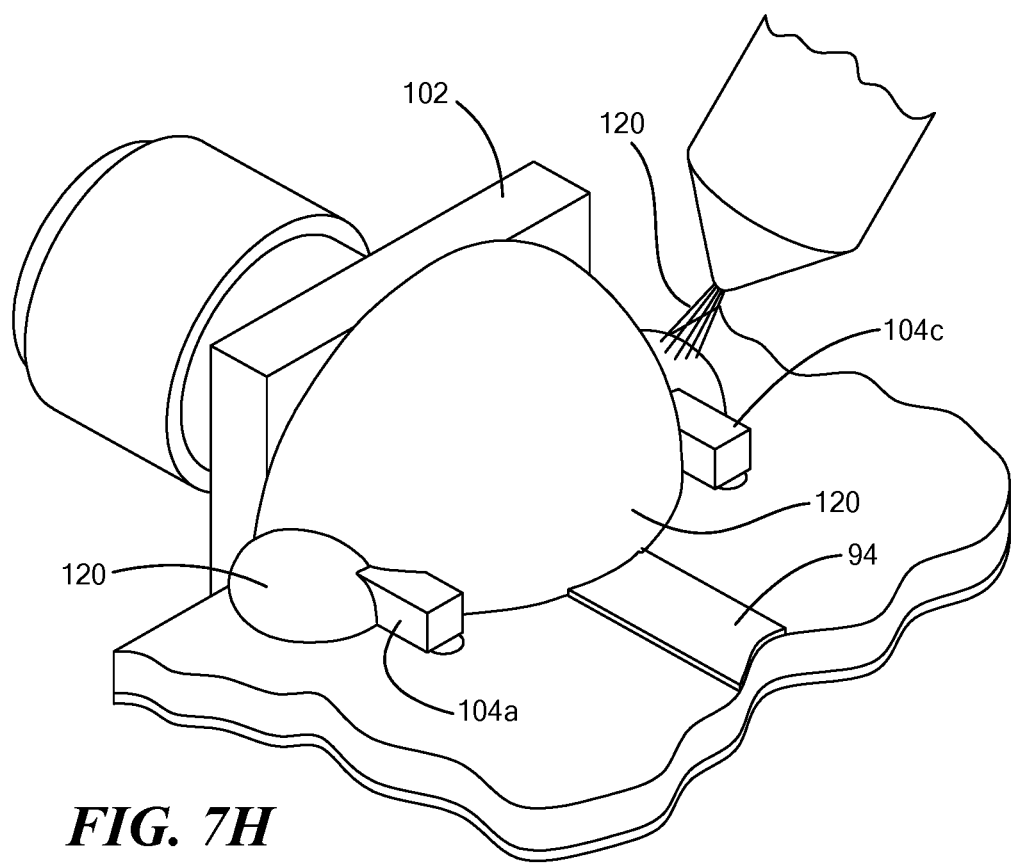
Figure 7I:
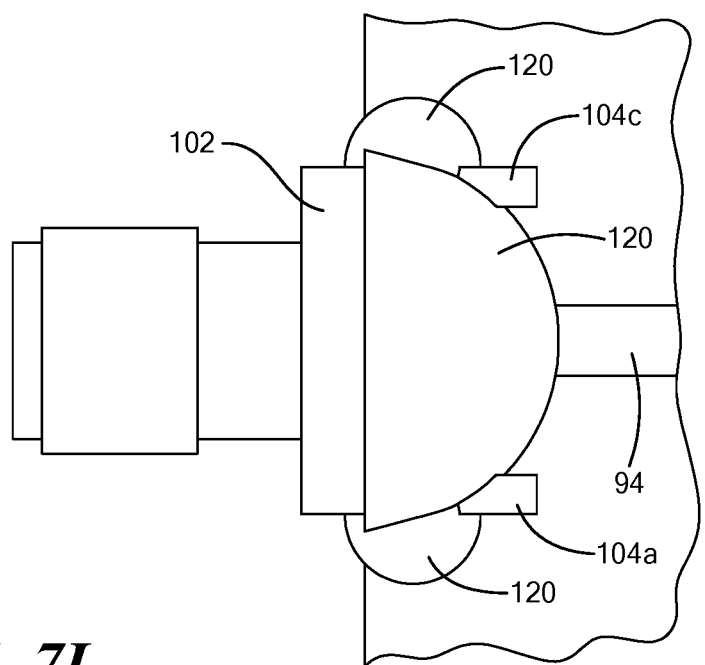

Referring now to FIGS. 7E-7I, dielectric material 120, here for example, the same material as material 72 described above, is formed over portions of the upper portions of the upper arms 104*a*, 104*c* (FIG. 7E), around the sides of the printed circuit board 92, and under the printed circuit board 92 (FIGS. 7F, 7G) and then over the pin 108, the interconnect region where the end of the pin 108 is soldered to the signal strip conductor 94 and portion of the upper surface of the printed circuit board 92 between the pin 108 and the arms 104*a*, 104*c*, and over lower arms 104*b*, 104*d* (FIGS. 7H, 7I). Thus, the entire connector-to-microwave transmission line interconnect region 140 (FIG. 7B) is covered with the dielectric material 120.

Figure 7J:
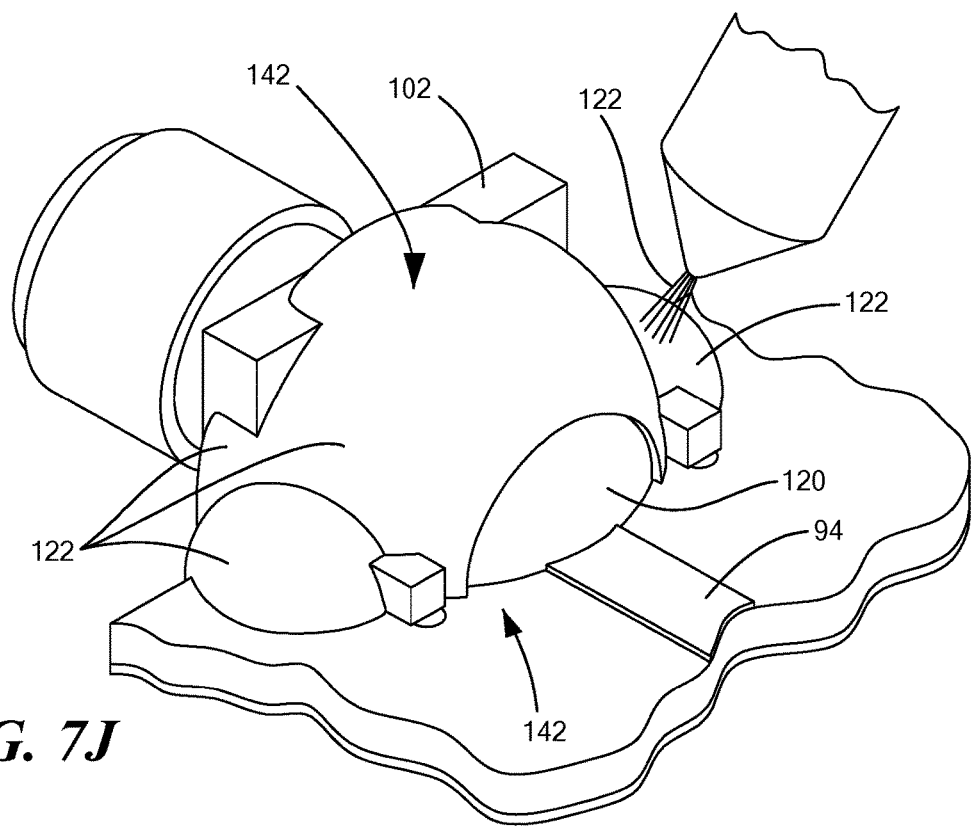
Figure 7K:
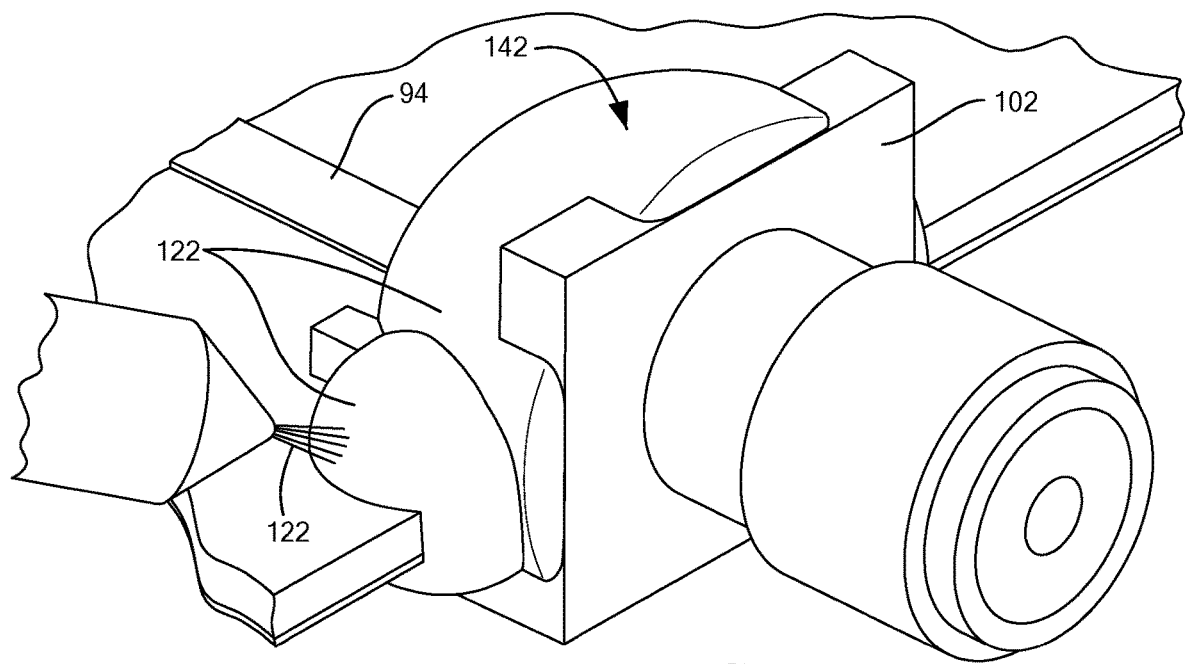
Figure 7L:
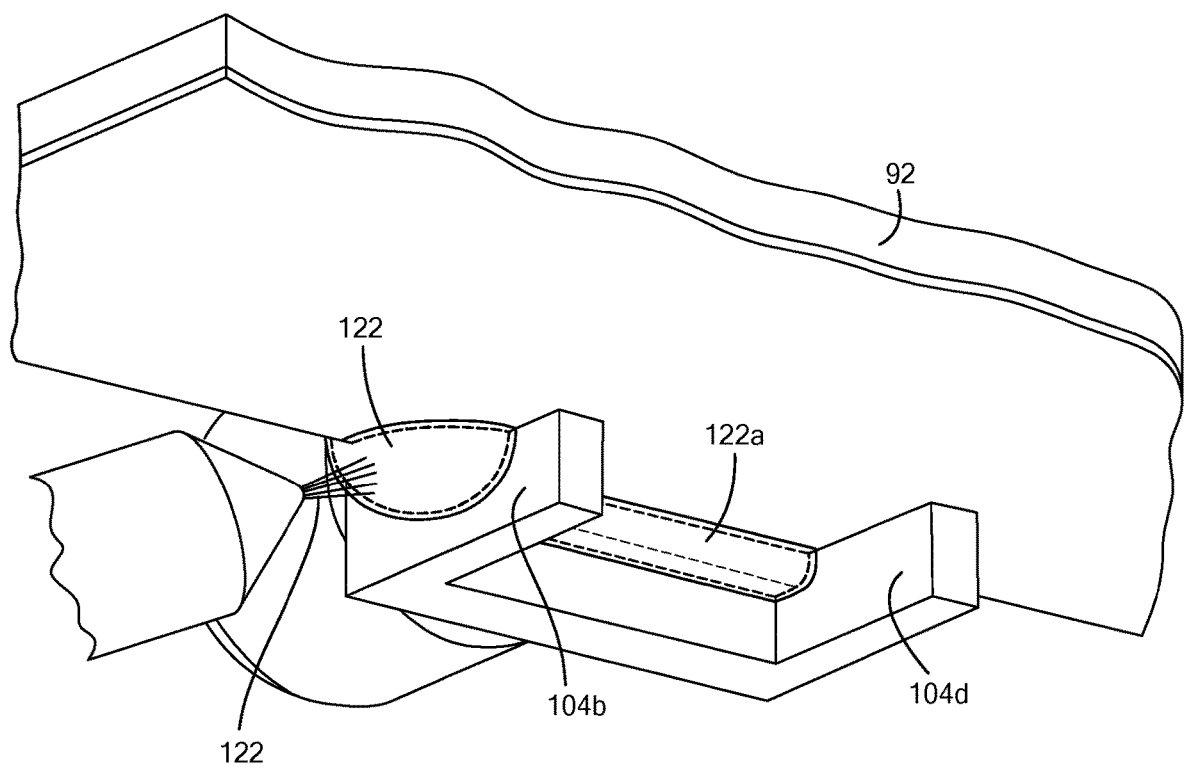

Next, referring to FIGS. 7J-7L, an electrically conductive ink 122, (here for example, a silver conductive ink from Paru, Ltd. Korea), is deposited over the portions of the dielectric material 120, including portions of the flange where the dielectric material 120 extends beyond the flange, as shown in FIGS. 7J-7M. It is also noted that the a portion 122*a* of the electrically conductive ink 122 is deposited over the bottom portion 30*a* of the elastic, dielectric 'pillow' material 30, as shown in FIG. 7G, as shown; it being noted that portions of the dielectric material 120 making conduct with the signal strip conductor 94 are not covered with the conductive ink 122, as shown in FIG. 7J thus forming an electrically conductive shield 142 for the connector-to-microwave transmission line interconnect region 140 (FIG. 7B) It is noted that the electrically conductive ink 122 is deposited on: portions of the flange 102; exposed portions of the uppers arms 104*a*, 104*c*; and around the outer sides of the sides of the connector-to-microwave transmission line interconnect region 140 (FIG. 7B) to thereby provide a continuous electrical shield to prevent RF leakage from the interface between the flange 102 and the printed circuit board 92, the bottom and the sides of the microwave transmission line interconnect region 140 (FIG. 7B). Here again, the dielectric, elastic material 30 and the dielectric material 120 have a Young's modulus selected, over a predetermined temperature range of both a temperature operating range $T_{OP}$ of the assembly and a storage temperature range $T_{SR}$ of the assembly to prevent the signal strip conductor line and the pin from being becoming electrically disconnected.

Thus, because the edge of the dielectric member 96 of the printed circuit board 92 are not in perfect contact with the connector, the dielectric, elastic material 30 is added. It serves two main purposes: 1) it acts as a cushion to absorb any TCE mismatches between the dielectric member 96 and the flange 102 (FIG. 7C) of the connector 90, and 2) it creates a seal between the dielectric member 96 and the flange 102. It is then covered with the conductive material 122, electrically connected to the connector housing, which is grounded. The arrangement creates an electric shield, preventing any radiation from leaking out between the connector 90 and the dielectric member 96.

Figure 8:
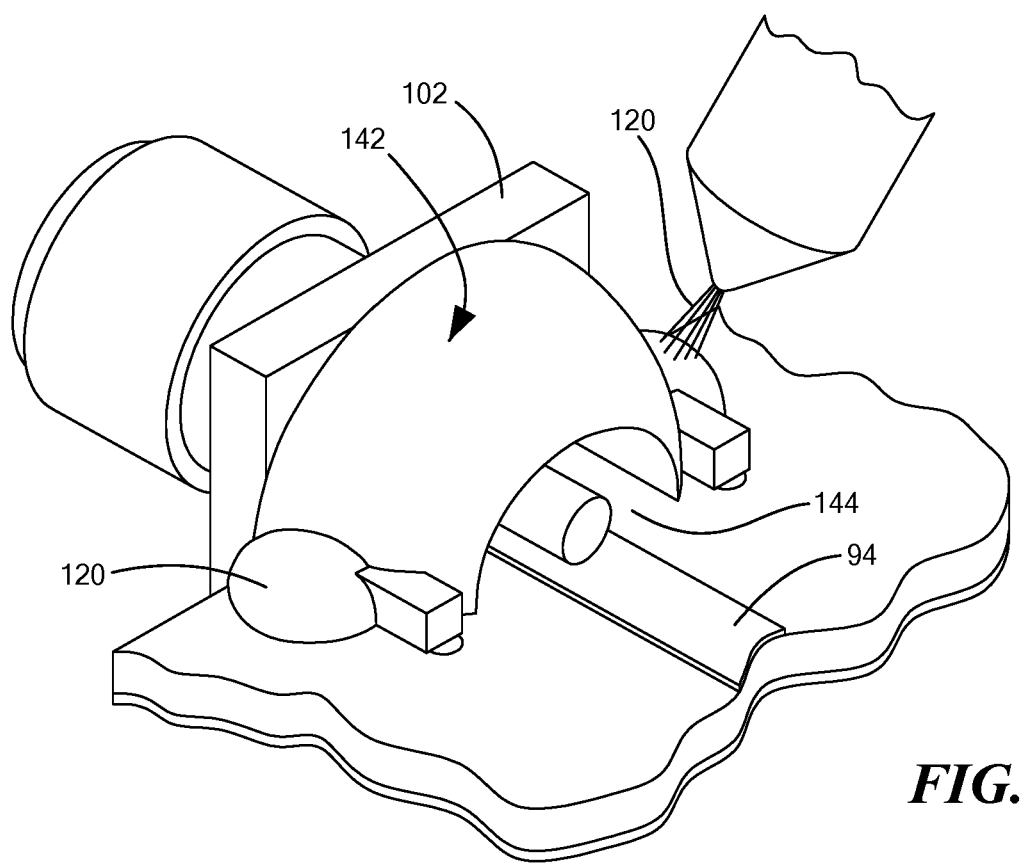
FIGS. 8 and 8' are perspective views of an electrical connector connected to a microwave transmission line of a printed circuit board at various stages in the manufacture thereof using an electrically conductive roof or shielding structure according to an alternative embodiment of the disclosure.
Figure 8:
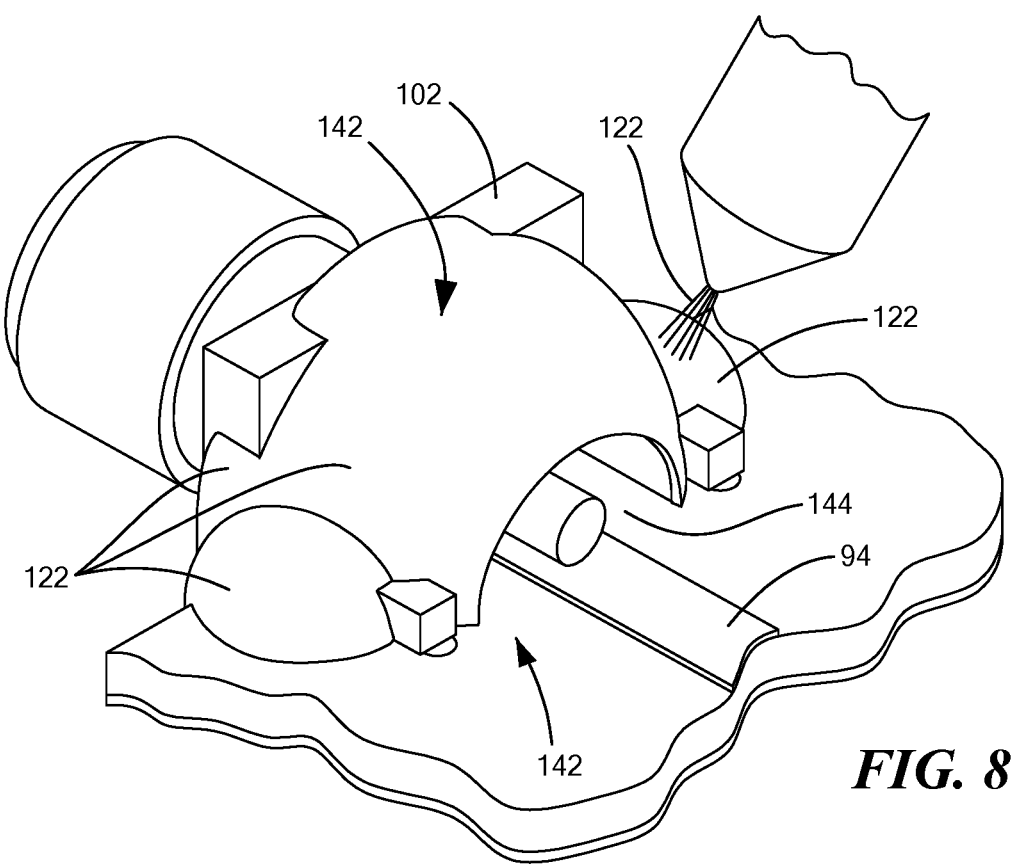

Referring now to FIGS. 8 and 8' an alternative embodiment is shown for the electrically conductive shield 142 of FIG. 7D. Here, the dielectric material 120 is formed with a semi-circular bore 144 there through to electrically insulated the pin 108 and portion of the signal strip conductor 94 connected to the pin 108 from the electrically conductive ink 122.

A number of embodiments of the disclosure have been described. Nevertheless, it will be understood that various modifications may be made without departing from the spirit and scope of the disclosure. For example in the embodiments described in connection with FIGS. 7A-7L, if the printed circuit board is much thinner than the space between the upper and lower arms, the upper surface of the printed circuit board may be held against the bottom surface of the upper arms with a shim, for example, and the dielectric "pillow" material 30 may be formed on the upper surfaces of the lower arms and then coated with an electrically conductive material. Accordingly, other embodiments are within the scope of the following claims.

What is claimed is:

1. An assembly, comprising:
   a transmission line, comprising: a dielectric structure: a signal strip conductor disposed on an upper surface of the dielectric structure; and a ground conductor disposed on the dielectric structure;
   a connector comprising: an electrically conductive housing electrically connected to the ground conductor; and a conductive pin dielectrically separated from the conductive housing, the conductive pin having an end portion projecting outwardly from the housing onto, and electrically connected to, an upper portion of the signal strip conductor at an interconnect region;
   a dielectric, elastic material disposed between opposing surfaces of the dielectric structure and the housing;
   a conductive layer disposed over the dielectric, elastic material, the conductive layer being disposed on an outer surface of the dielectric, elastic material and electrically connected to the ground conductor; and
   wherein the dielectric, elastic material has a Young's modulus selected, over a predetermined temperature range of both a temperature operating range $T_{OP}$ of the assembly and a storage temperature range $T_{SR}$ of the assembly to prevent the signal strip conductor line and the pin from being becoming electrically disconnected.

2. An assembly, comprising:
   a transmission line, comprising: a dielectric structure; a signal strip conductor disposed on an upper surface of the dielectric structure; and a ground conductor disposed on the dielectric structure;
   a connector comprising: an electrically conductive housing electrically connected to the ground conductor; and a conductive pin dielectrically separated from the conductive housing, the conductive pin having an end portion projecting outwardly from the housing onto, and electrically connected to, an upper portion of the signal strip conductor at an interconnect region;
   a dielectric, elastic material disposed between opposing surfaces of the dielectric structure and the housing;

a conductive layer disposed over the dielectric, elastic material, the conductive layer being disposed on an outer surface of the dielectric, elastic material and electrically connected to the ground conductor; and including an electrically conductive shield comprising: a dielectric support structure; and an electrically conductive layer disposed on an outer surface of the dielectric support structure, the electrically conductive shield being disposed the opposing surfaces of the dielectric structure and the housing.

3. An assembly, comprising:

a transmission line, comprising: a dielectric structure; a signal strip conductor disposed on an upper surface of the dielectric structure; and a ground conductor disposed on the dielectric structure;

a connector comprising: an electrically conductive housing electrically connected to the ground conductor; and a conductive pin dielectrically separated from the conductive housing, the conductive pin having an end portion projecting outwardly from the housing onto, and electrically connected to, an upper portion of the signal strip conductor at an interconnect region;

wherein the electrically conductive housing and the dielectric structure are separated by a gap;

a dielectric, elastic material disposed in the gap;

a conductive layer disposed over the dielectric elastic material, the conductive layer being disposed on an outer surface of the dielectric, elastic material and electrically connected to the ground conductor, wherein an intermediate portion of the conductive pin extending from the housing to the interconnect region passes over portions of the gap; and wherein the conductive layer provides electrical shielding to the intermediate portion of the conductive; and wherein the dielectric, elastic material has a Young's modulus selected, over a predetermined temperature range of both a temperature operating range $T_{OP}$ of the assembly and a storage temperature range $T_{SR}$ of the assembly to prevent the signal strip conductor line and the pin from being becoming electrically disconnected.

4. An assembly, comprising:

a transmission line, comprising: a dielectric structure; a signal strip conductor disposed on an upper surface of the dielectric structure; and a ground conductor disposed on the dielectric structure;

a connector comprising: an electrically conductive housing electrically connected to the ground conductor; and a conductive pin dielectrically separated from the conductive housing, the conductive pin having an end portion projecting outwardly from the housing onto, and electrically connected to, an upper portion of the signal strip conductor at an interconnect region;

wherein the electrically conductive housing and the dielectric structure are separated by a gap;

a dielectric, elastic material disposed in the gap;

a conductive layer disposed over the dielectric, elastic material, the conductive layer being disposed on an outer surface of the dielectric, elastic material and electrically connected to the ground conductor, wherein an intermediate portion of the conductive pin extending from the housing to the interconnect region passes over portions of the gap; and wherein the conductive layer provides electrical shielding to the intermediate portion of the conductive; and including an electrically conductive shield comprising: a dielectric support structure; and an electrically conductive layer disposed on an outer surface of the dielectric support structure, the electrically conductive shield being disposed the opposing surfaces of the dielectric structure and the housing.

5. An assembly, comprising:

a transmission line, comprising: a dielectric structure; a signal strip conductor disposed on an upper surface of the dielectric structure; and a ground conductor disposed on the dielectric structure;

a connector, separated from the transmission line by a gap, the connector comprising: an electrically conductive housing electrically connected to the ground conductor, and a conductive pin, the conductive pin having an end portion projecting outwardly from the housing onto, and electrically connected to, an upper portion of the signal strip conductor, the electrically conductive pin being dielectrically separated from the conductive housing;

an electrically conductive shield disposed over the gap and over a portion of the conducive pin passing between the electrically conductive housing and the end portion of the conductive pin, comprising:

a dielectric support; and an electrically conductive material disposed on, and supporting by, outer surfaces of the dielectric support, the electrically conductive material being: disposed over the portion of the conducive pin passing between the electrically conductive housing and the end portion of the conductive pin conductive pin and being electrically connected to the electrically conductive housing to provide an electrical shield over portion of the conducive pin passing between the electrically conductive housing and the end portion of the conductive pin.

6. The assembly recited in claim 5 including a dielectric, elastic material disposed in the gap wherein the dielectric support is an elastic material.

7. The assembly recited in claim 6 wherein the a dielectric, elastic material has a Young's modulus selected, over a predetermined temperature range of both a temperature operating range $T_{OP}$ of the assembly and a storage temperature range $T_{SR}$ of the assembly to prevent the end portion of the conductive pin and the upper portion of the signal strip conductor from becoming electrically disconnected.

8. The assembly recited in claim 6 wherein the dielectric, elastic material has a conductive layer disposed on an outer surface and electrically connected to the ground conductor to provide electrical shielding to the portion of the conducive pin passing between the electrically conductive housing and the end portion of the conductive pin conductive pin.

9. An electrically conductive shield for a microwave transmission line-electrical connector interconnect region, comprising: (A) a dielectric support structure having: (a) an inner portion disposed on an end portion of a conductive pin passing through the connector and dielectrically isolated from an electrically conductive housing of the connection, such end portion of the conductive pin being deposed on, and electrically connected to, a signal strip conductor of the microwave transmission line in the interconnect region, the electrically conductive housing being electrically connected to a ground conductor of the microwave transmission line; and, (b) an outer portions disposed over portions of a dielectric structure of the transmission line adjacent to sides of the signal strip conductor; and (B) an electrically conductive material disposed on, and supported by, outer surfaces of the dielectric support structure; and wherein the electrically conductive material is: (a) disposed over the end portion of the conductive pin; (b)

dielectrically separated from the end portion of the conductive pin by the inner portions of the dielectric support structure; and (c) electrically connected to the electrically conductive housing of the connector, to provide an electrical shield over the end portion of the conductive pin.

10. The electrically conductive shield recited in claim 9 including a dielectric, elastic material disposed in a gap between the connector and the dielectric support structure.

11. The electrically conductive shield recited in claim 10 wherein the dielectric, elastic material has a Young's modulus selected, over a predetermined temperature range of both a temperature operating range $T_{OP}$ and a storage temperature range $T_{SR}$ to prevent the end portion of the conductive pin and the upper portion of the signal strip conductor from becoming electrically disconnected.

12. An assembly, comprising:
  a bulkhead;
  an electrically conductive layer;
  a printed circuit board mounted on an upper surface of the electrically layer, the printed circuit board being separated from the bulkhead by a gap, the gap being disposed over a portion of the upper surface of the electrically conductive layer;
    wherein the printed circuit board includes a transmission line having:
  an electrical conductor having inner portions disposed between a pair of ground plane conductors; and, an outer end portion exposed by a cutout in an upper portion of the printed circuit board;
  a bulkhead connector having a conductive pin projects outwardly from the bulkhead, an outer end portion of the conductive pin being disposed on, and electrically connected to, an outer portion of the electrical conductor with the outer end portion of the conductive pin being disposed over the gap;
  an elastic material having an electrically conductive upper surface and electrically side surfaces is disposed in the gap and on portion of the upper surface of the electrically conductive layer;
  an electrically conductive shield electrically connected to: (a) the electrically conductive, upper surface of the elastic material; (b) the bulkhead; (c) an upper one of a pair of ground plane conductors of the printed circuit board; and (c) the outer end portion of the conductive pin of the bulkhead connector and the outer conductor portion of the printed circuit board.

13. The assembly recited in claim 12 wherein the printed circuit board and the bulkhead have predetermined thermal coefficient of expansions, and wherein the elastic material has a predetermined thermal coefficient of expansion related to the predetermined thermal coefficient of expansions of the printed circuit board and the bulkhead.

14. The assembly recited in claim 13 wherein the electrically conductive shield comprises an elastic material, and wherein the electrically conductive has a predetermined coefficient of thermal expansion, and wherein the predetermined coefficient of thermal expansion of electrically conductive shield is related to the predetermined thermal coefficient of expansions of the printed circuit board and the bulkhead.

15. A method for forming an electrical enclosure for an outer end portion of a conductive pin of a bulkhead connector and an outer portion of an electrical conductor of a printed circuit board, the printed circuit board being mounted to an electrically conductive layer, the method comprising:
  using additive manufacturing, deposing an elastic material on a side of the printed circuit board, the elastic material having an electrically conductive, upper surface and electrically conductive side surfaces;
  attaching the bulkhead to the electrically conductive layer with an outer surface of the elastic material being disposed against a side of the bulkhead and with the outer end portion of the conductive pin being connected to the outer portion of the electrical conductor of the printed circuit board; and
  providing an electrically conductive shield having an outer surface electrically connected to: (a) the electrically conductive, upper surface of the elastic material; (b) the bulkhead; (c) an upper one of a pair of ground plane conductors of the printed circuit board; and disposed over the outer end portion of the conductive pin of the bulkhead connector and the outer portion of the electrical conductor of the printed circuit board.

16. The method recited in claim 15 wherein the electrically conductive shield is formed comprising: forming a dielectric support structure and covering the dielectric support structure with a conductive coating.

17. An assembly, comprising:
  a transmission line, comprising: a dielectric structure; a signal strip conductor disposed on an upper surface of the dielectric structure; and a ground conductor on the dielectric structure;
  a connector comprising: a housing; and a conductive pin, the conductive pin projecting outwardly from the housing onto, and electrically connected to, an upper end portion of the signal strip conductor;
  an electrically conductive shield comprising: dielectric material having an inner portion disposed over the upper end portion of the conductive pin and having outer portions disposed on the upper surface of the dielectric structure and over side portions of the upper end portion of the signal strip conductor; and an electrically conductive material disposed on an outer surface of the inner portion of the dielectric structure and on an outer surface of the outer portions of the dielectric structure to provide an electrical shield over the upper and side portions of the signal strip conductor.

18. A method for forming a radio frequency shield for a connector-to-microwave transmission line interconnect region between a signal pin of an electrical connector and a signal strip conductor, interconnect region having the signal pin and the signal strip conductor disposed in an overlying relationship on an upper surface of a dielectric structure of a microwave transmission line, the method comprising:
  providing a solid dielectric supporting structure having: an upper portion disposed over the signal pin and the signal strip conductor of the connector-to-microwave transmission line interconnect region and; side portions disposed over side portions of the connector-to-microwave transmission line interconnect region; and
  forming an electrically conductive material on: an outer surface of the solid dielectric supporting structure, to provide an electrical shield over the signal pin and the signal strip conductor of the connector-to-microwave transmission line interconnect region; and side portions of the solid dielectric supporting structure.

19. The method recited in claim 18 wherein the solid dielectric supporting structure and the electrically conductive material are formed using additive manufacture.

20. The method recited in claim 18 wherein the dielectric support structure is an elastic material.

21. The method recited in claim 18 wherein the electrically conductive shield has a Young's modulus selected, over a predetermined temperature range of both a temperature operating range $T_{OP}$ and a storage temperature range $T_{SR}$ to prevent the end portion of the signal pin and the upper portion of the signal strip conductor from becoming electrically disconnected.

22. A radio frequency shield for a connector-to-microwave transmission line interconnect region between the signal pin of an electrical connector and a signal strip conductor, interconnect region having the signal pin and the signal strip conductor disposed in an overlying relationship on an upper surface of a dielectric structure of a microwave transmission line, comprising:
   a solid dielectric supporting structure having: an upper portion disposed over the signal pin and the signal strip conductor of the connector-to-microwave transmission line interconnect region and; side portions disposed over side portions of the connector-to-microwave transmission line interconnect region; and
   an electrically conductive material on: an outer surface of the solid dielectric supporting structure, to provide an electrical shield over the conductive pin and the signal strip conductor of the connector-to-microwave transmission line interconnect region; and side portions of the solid dielectric supporting structure.

23. A method for forming a radio frequency shield for a connector-to-microwave transmission line interconnect region, such region having a signal pin of an electrical connector and a signal strip conductor of a microwave transmission line, the signal pin and the signal strip conductor being disposed in an overlying relationship on an upper surface of a dielectric structure of the microwave transmission line, the electrical conductor and an outer edge of the dielectric structure being separated by a gap, the signal pin passing through the gap, the method comprising:
   providing an elastic material in the gap;
   providing a solid dielectric supporting structure having an upper portion disposed over the elastic material; and
   forming an electrically conductive material on an outer surface of the solid dielectric supporting structure to provide an electrical shield over the gap.

24. The method recited in claim 23 wherein the solid dielectric supporting structure and the electrically conductive material are formed using additive manufacture.

25. The method recited in claim 23 wherein the elastic material has a Young's modulus selected, over a predetermined temperature range of both a temperature operating range $T_{OP}$ and a storage temperature range $T_{SR}$ to prevent the signal pin and the upper portion of the signal strip conductor from becoming electrically disconnected.

26. A method comprising:
providing a transmission line, comprising: a dielectric structure; a signal strip conductor disposed on an upper surface of the dielectric structure; and a ground conductor disposed on the dielectric structure;
providing a connector comprising: an electrically conductive housing electrically connected to the ground conductor; and a conductive pin dielectrically separated from the conductive housing, the conductive pin having an end portion projecting outwardly from the housing onto, and electrically connected to, an upper portion of the signal strip conductor at an interconnect region;
disposing an dielectric, elastic material between opposing surfaces of the dielectric structure and the housing;
disposing a conductive layer over the dielectric, elastic material, the conductive layer being disposed on an outer surface of the dielectric, elastic material and electrically connected to the ground conductor; and
wherein the dielectric, elastic material has a Young's modulus selected, over a predetermined temperature range of both a temperature operating range $T_{OP}$ of the assembly and a storage temperature range $T_{SR}$ of the assembly to prevent the signal strip conductor line and the pin from being becoming electrically disconnected.

27. A method comprising:
providing a transmission line, comprising: a dielectric structure; a signal strip conductor disposed on an upper surface of the dielectric structure; and a ground conductor disposed on the dielectric structure;
providing a connector comprising: an electrically conductive housing electrically connected to the ground conductor; and a conductive pin dielectrically separated from the conductive housing, the conductive pin having an end portion projecting outwardly from the housing onto, and electrically connected to, an upper portion of the signal strip conductor at an interconnect region;
disposing an dielectric, elastic material between opposing surfaces of the dielectric structure and the housing;
disposing a conductive layer over the dielectric, elastic material, the conductive layer being disposed on an outer surface of the dielectric, elastic material and electrically connected to the ground conductor; and
including providing an electrically conductive shield comprising: a dielectric support structure; and an electrically conductive layer disposed on an outer surface of the dielectric support structure, the electrically conductive shield being disposed the opposing surfaces of the dielectric structure and the housing.

* * * * *